(12) United States Patent
Gao et al.

(10) Patent No.: US 10,573,639 B2
(45) Date of Patent: Feb. 25, 2020

(54) SILICON CONTROLLED RECTIFIER (SCR) BASED ESD PROTECTION DEVICE

(71) Applicant: GLOBALFOUNDRIES Singapore Pte. Ltd., Singapore (SG)

(72) Inventors: Wei Gao, Singapore (SG); Shaoqiang Zhang, Singapore (SG); Chien-Hsin Lee, Malta, NY (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 116 days.

(21) Appl. No.: 15/057,007

(22) Filed: Feb. 29, 2016

(65) Prior Publication Data

US 2017/0250176 A1 Aug. 31, 2017

(51) Int. Cl.
| | |
|---|---|
| H01L 27/02 | (2006.01) |
| H01L 21/84 | (2006.01) |
| H01L 21/762 | (2006.01) |
| H01L 29/66 | (2006.01) |
| H01L 29/744 | (2006.01) |
| H01L 29/87 | (2006.01) |
| H01L 29/06 | (2006.01) |

(52) U.S. Cl.
CPC .... H01L 27/0262 (2013.01); H01L 21/76264 (2013.01); H01L 21/84 (2013.01); H01L 29/66356 (2013.01); H01L 29/744 (2013.01); H01L 29/87 (2013.01); H01L 29/0649 (2013.01); H01L 29/0692 (2013.01)

(58) Field of Classification Search
CPC ..... H01L 27/0262; H01L 23/60; H01L 21/84; H01L 21/76264; H01L 29/744; H01L 29/0649; H01L 29/1095; H01L 29/66356
See application file for complete search history.

(56) References Cited

U.S. PATENT DOCUMENTS

| | | | |
|---|---|---|---|
| 6,387,739 B1 | 5/2002 | Smith, III | |
| 6,642,088 B1 * | 11/2003 | Yu | H01L 21/76264 |
| | | | 257/E21.564 |

(Continued)

OTHER PUBLICATIONS

Olivier Marichal et al., Conference paper SCR based ESD protection in nanometer SOI technologies, EOS/ESD symposium 2005, Sarnoff Europe and the ESD Association.

*Primary Examiner* — Charles D Garber
*Assistant Examiner* — S M Sohel Imtiaz
(74) *Attorney, Agent, or Firm* — Thompson Hine LLP

(57) ABSTRACT

The SCR-based ESD device has a 4-layered PNPN structure (NPN and PNP junction transistors) disposed in SOI having first and second device wells (N-well and P-well) abut forming a NP junction near a midline. First and second contact regions disposed in device wells are coupled to high and low power sources (I/O pad and ground). Internal isolation regions (shallower STI) extending partially not touching the bottom of surface substrate separate the first and second contact regions. A vertical gate is disposed over the NP junction or over a shallower STI which overlaps the NP junction and separate the second contact regions in x-direction. One or more horizontal gates separate the second contact regions in y-direction and guide the device wells underneath the shallower STI to outer edges to connect with the first contact regions for body contacts. A process for forming the device is also disclosed and is compatible with CMOS processes.

9 Claims, 21 Drawing Sheets

(56) References Cited

U.S. PATENT DOCUMENTS

| | | | |
|---|---|---|---|
| 6,720,622 B1* | 4/2004 | Yu | H01L 27/0262 257/173 |
| 6,963,113 B2 | 11/2005 | Ang et al. | |
| 7,023,029 B1 | 4/2006 | Vashchenko et al. | |
| 7,943,438 B2 | 5/2011 | Gauthier, Jr. et al. | |
| 8,193,560 B2* | 6/2012 | Gendron | H01L 27/0259 257/173 |
| 8,692,291 B2* | 4/2014 | Clark, Jr. | H01L 21/845 257/173 |
| 2004/0033645 A1* | 2/2004 | Yu | H01L 21/76264 438/133 |
| 2004/0164354 A1* | 8/2004 | Mergens | H01L 27/0277 257/355 |
| 2005/0205938 A1* | 9/2005 | Yagishita | H01L 21/84 257/369 |
| 2005/0287759 A1* | 12/2005 | Wang | H01L 21/82341 438/400 |
| 2007/0040235 A1* | 2/2007 | Chan | H01L 21/76229 257/510 |
| 2007/0262386 A1* | 11/2007 | Gossner | H01L 27/0262 257/355 |
| 2007/0267700 A1* | 11/2007 | Russ | H01L 27/0255 257/355 |
| 2008/0122006 A1* | 5/2008 | Williams | H01L 21/26513 257/371 |
| 2009/0140335 A1* | 6/2009 | Schneider | H01L 29/0847 257/344 |
| 2009/0179272 A1* | 7/2009 | Campi, Jr. | H01L 29/1083 257/365 |
| 2009/0206367 A1* | 8/2009 | Gauthier, Jr. | H01L 27/0259 257/173 |
| 2010/0103570 A1* | 4/2010 | Song | H01L 27/0262 361/56 |
| 2012/0043583 A1* | 2/2012 | Abou-Khalil | H01L 27/0262 257/157 |
| 2012/0257317 A1* | 10/2012 | Abou-Khalil | H01L 27/0262 361/56 |
| 2013/0009204 A1* | 1/2013 | Song | H01L 27/0262 257/119 |
| 2015/0008476 A1* | 1/2015 | Shrivastava | H01L 27/0262 257/133 |
| 2015/0060939 A1* | 3/2015 | Di Sarro | G06F 17/5072 257/140 |
| 2015/0102384 A1* | 4/2015 | Zhan | H01L 27/0262 257/173 |
| 2016/0300832 A1* | 10/2016 | Besse | H01L 27/0259 |
| 2017/0257088 A1* | 9/2017 | Wu | H01L 27/0262 |

* cited by examiner

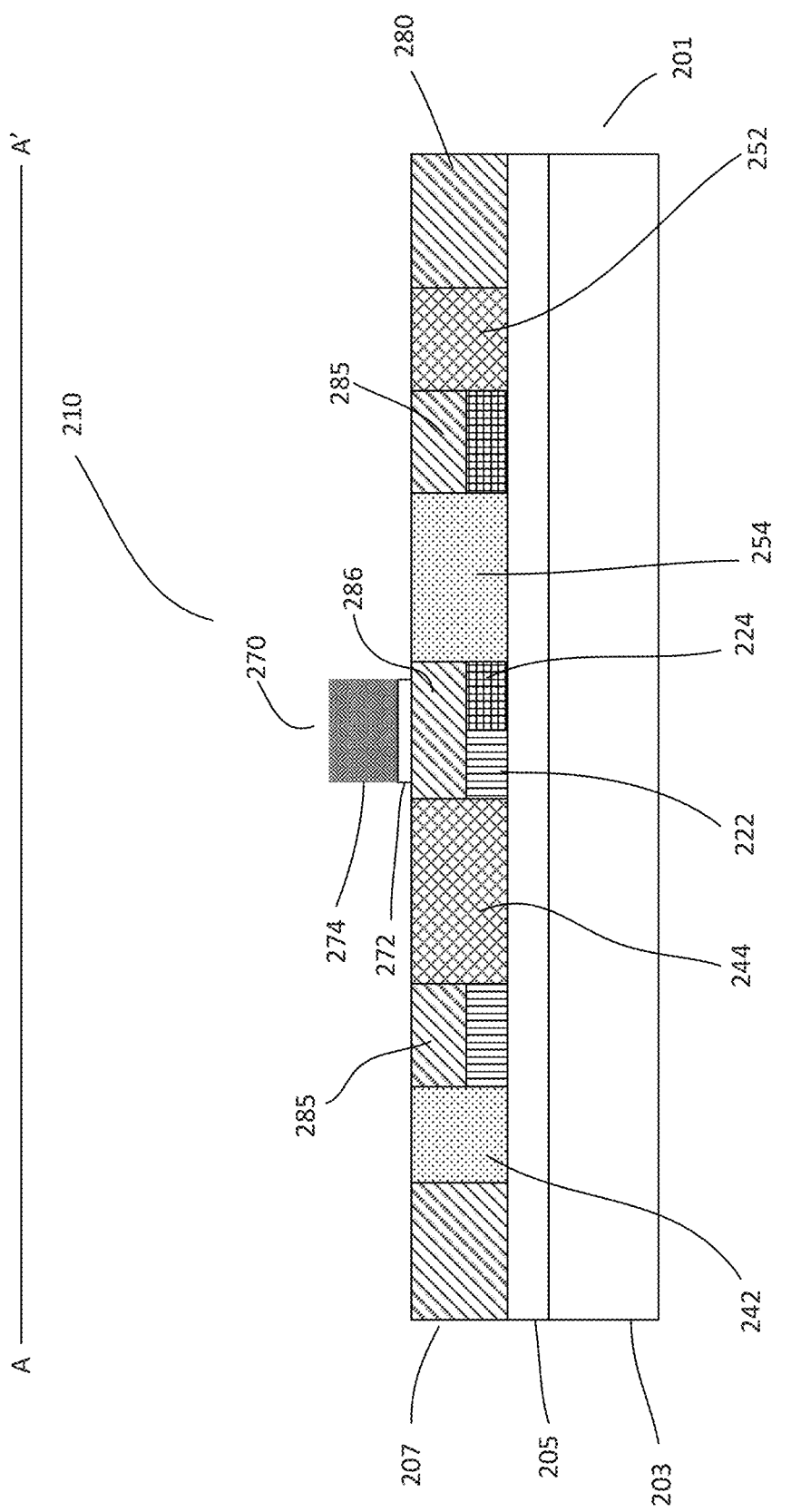

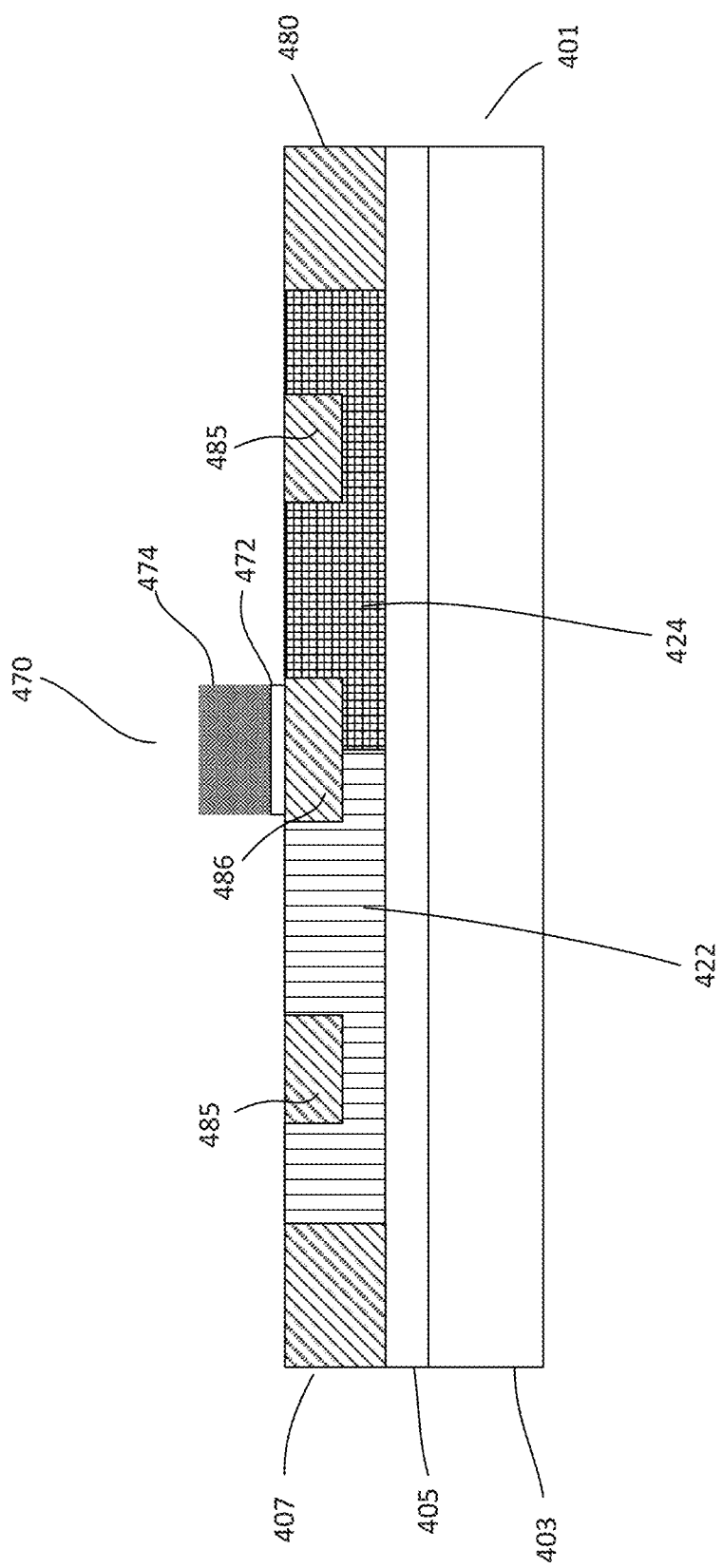
Fig. 4i₁

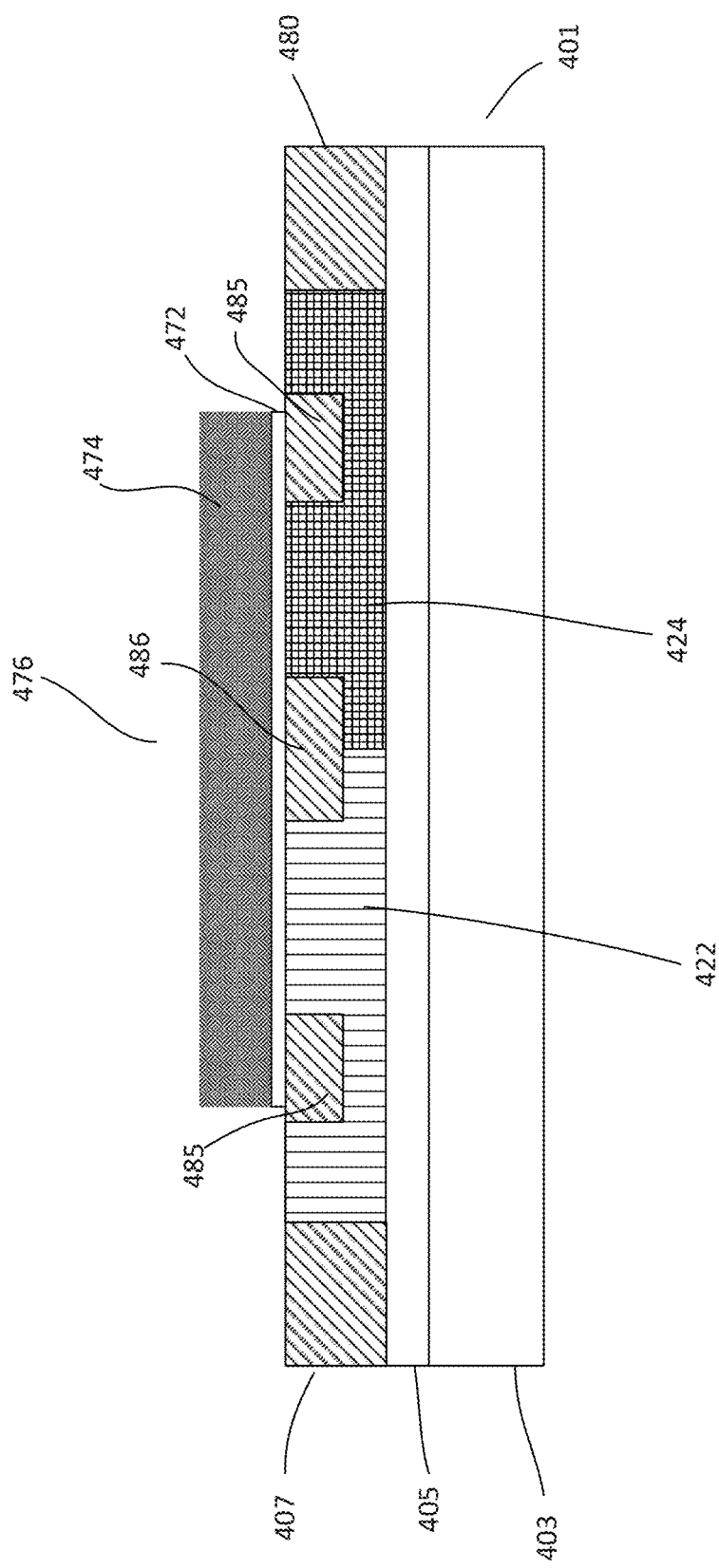
Fig. 4i₂

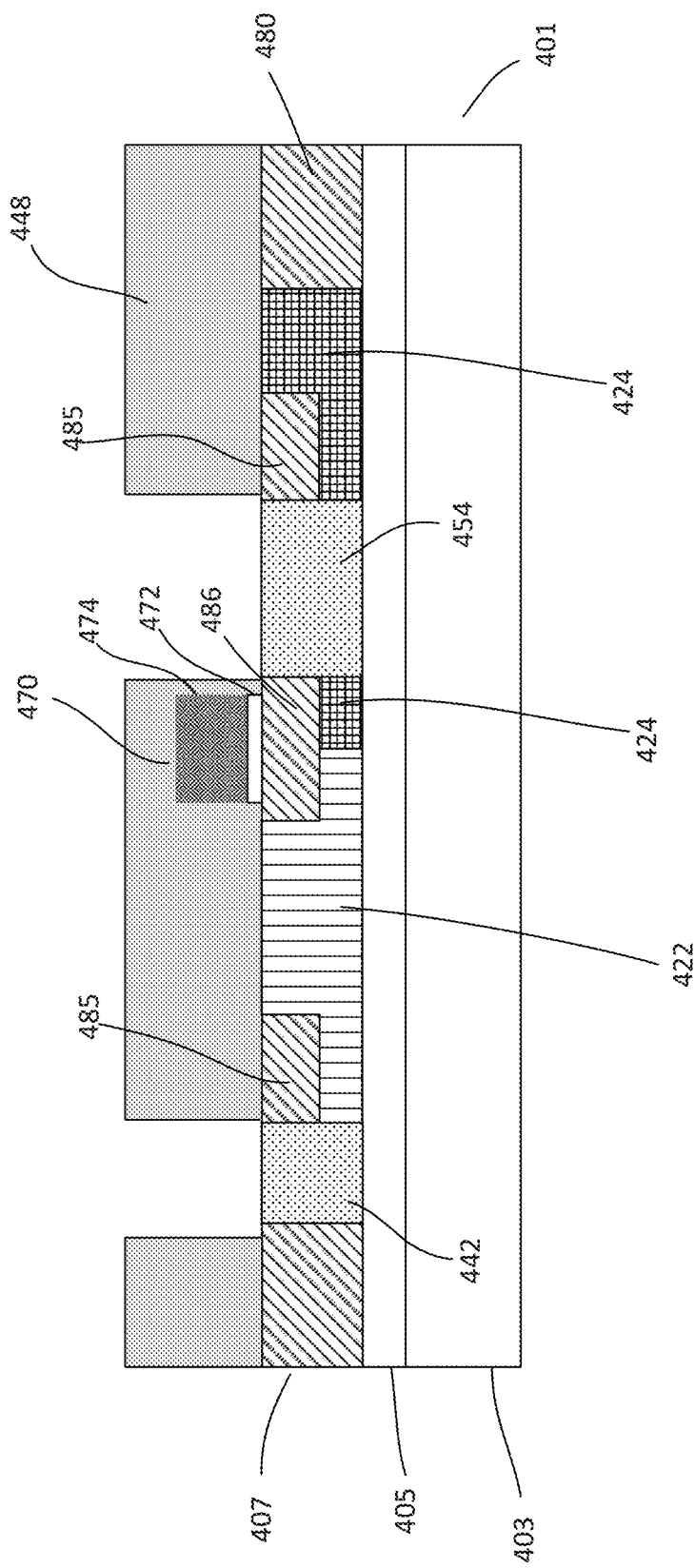

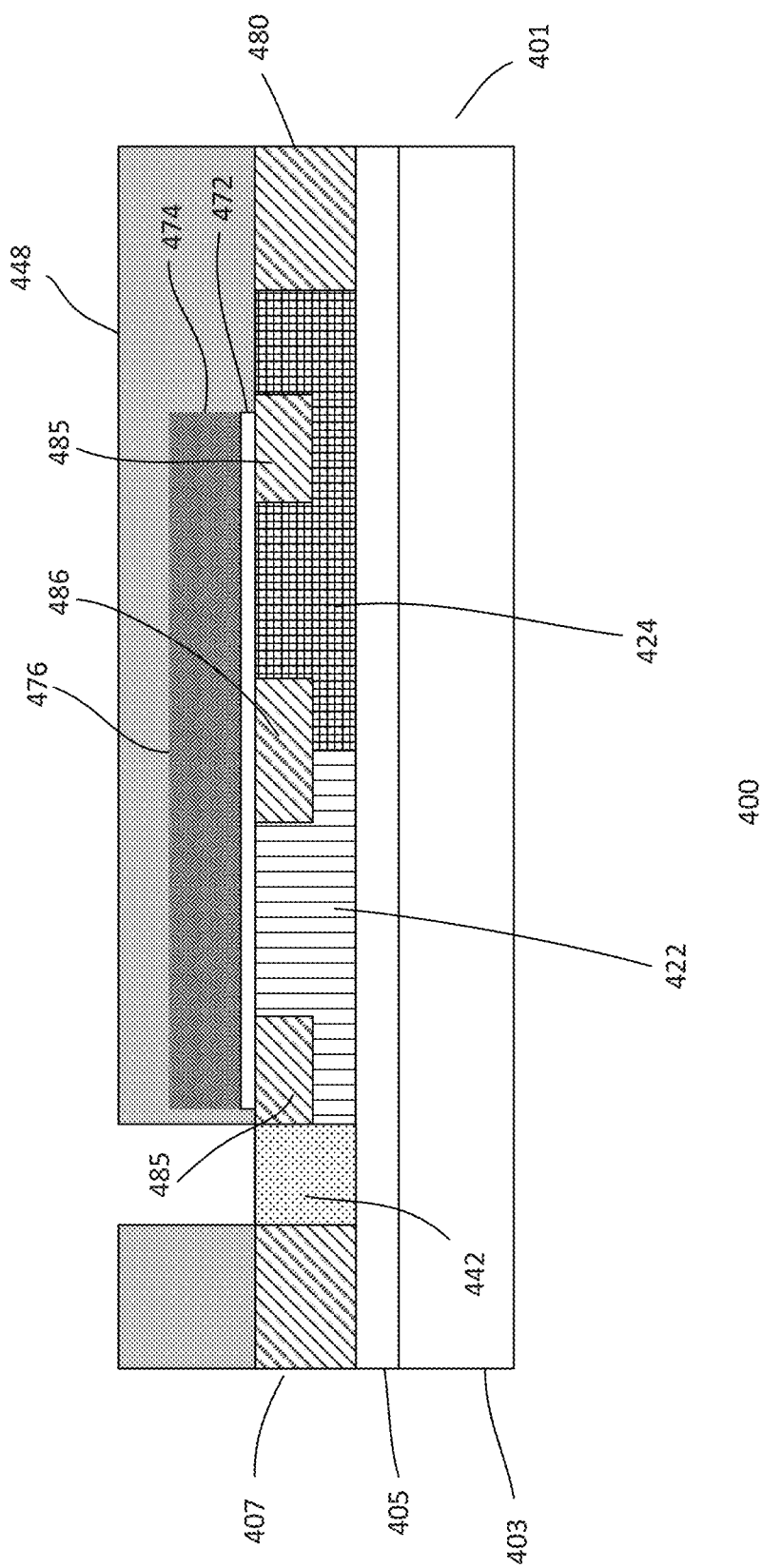

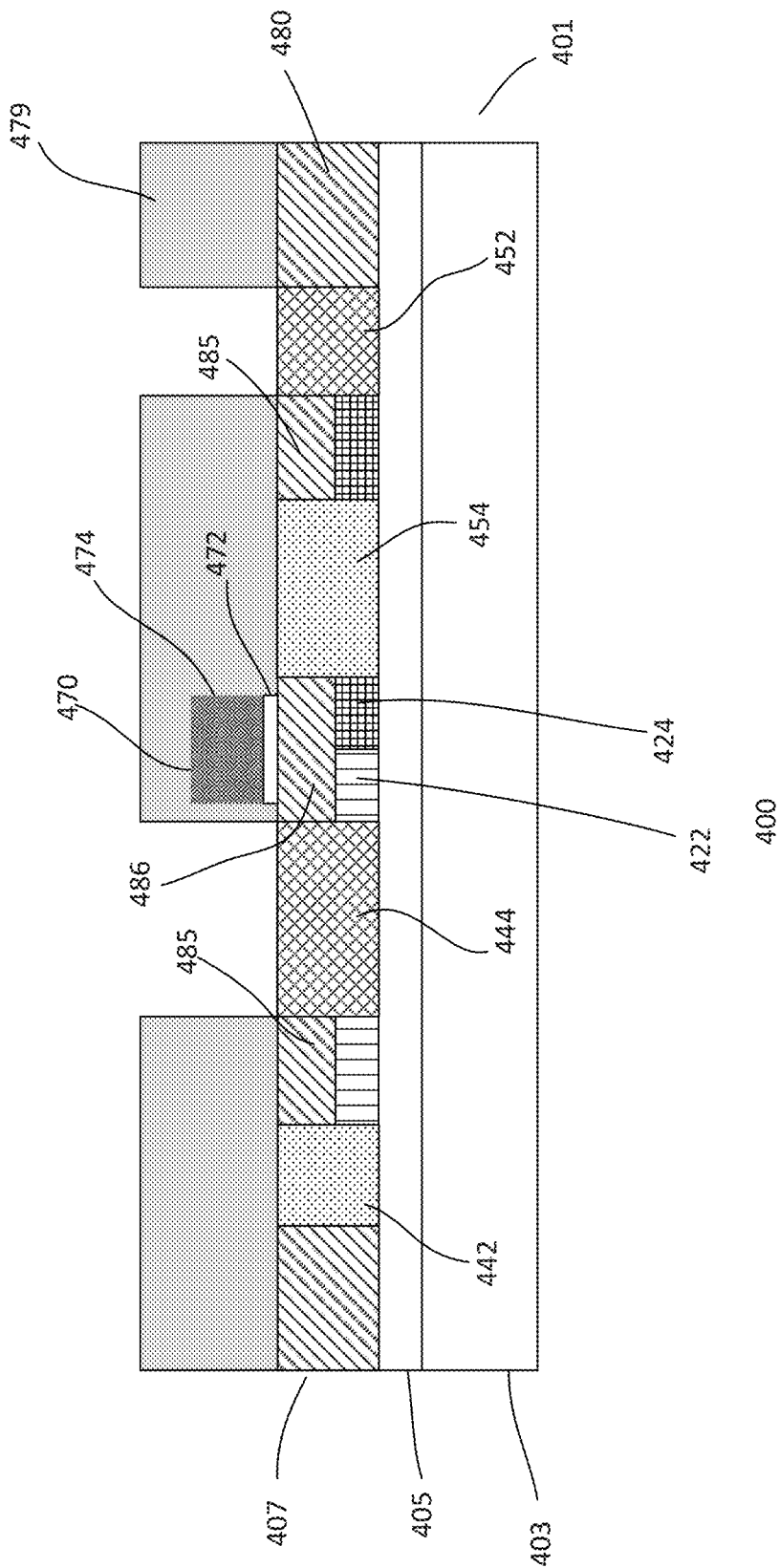
Fig. 4k₁

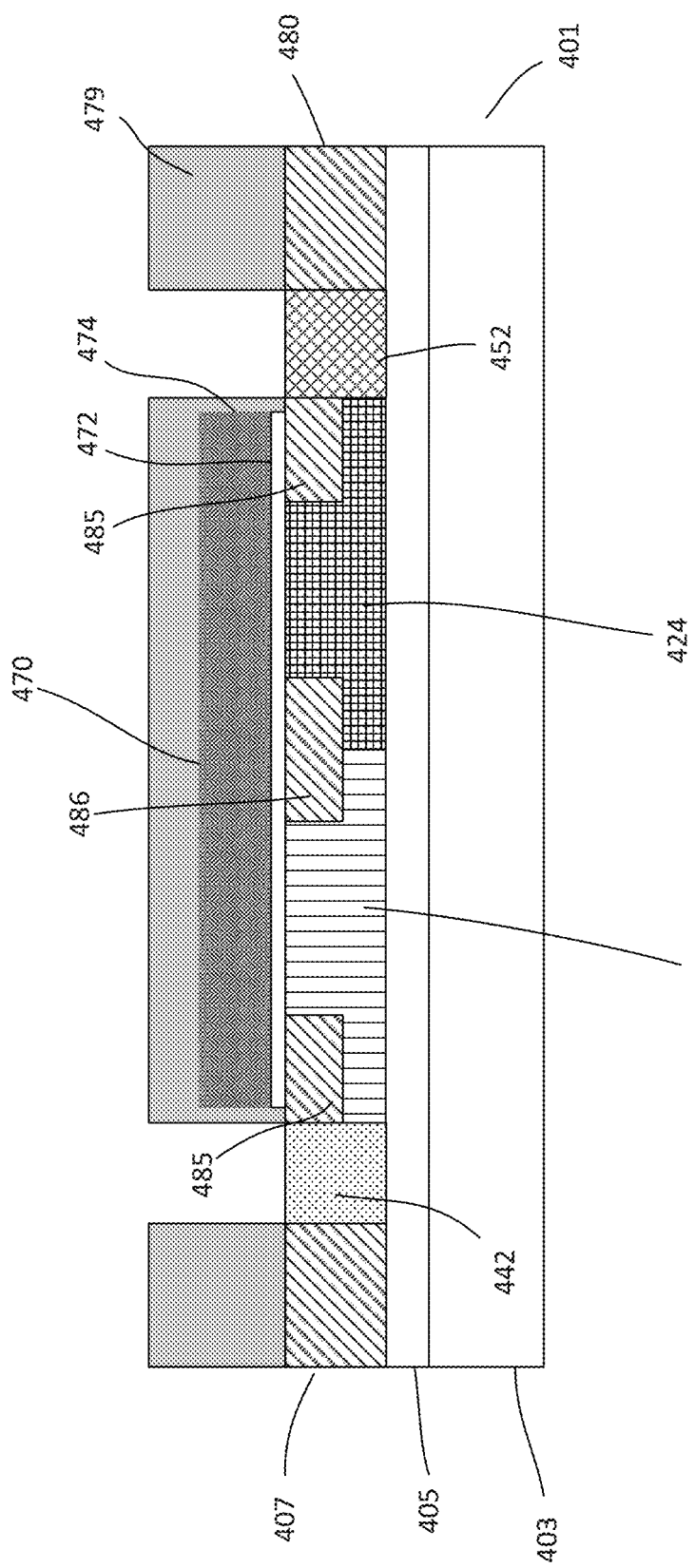
Fig. 4k₂

SILICON CONTROLLED RECTIFIER (SCR) BASED ESD PROTECTION DEVICE

BACKGROUND

Electrostatic discharge (ESD) generated from static electricity is usually characterized by fast transient high voltage discharge. An ESD event can occur in electrical and electronic circuits, such as an integrated circuit. It can create sufficiently high voltage to cause destructive breakdown of devices connected to, for example, the inputs and/or outputs of the integrated circuits (ICs). Various ESD protection schemes have been introduced to protect the ICs from an ESD event. Silicon controlled rectifier (SCR) is typically used as one of the ESD protection schemes.

Crystalline-on-insulator (COI) substrates, such as silicon-on-insulator (SOI) substrates, are garnering interest since they have lower parasitic capacitance due to isolation from the bulk silicon. This improves power consumption. However, conventional SCR-based ESD protection components formed on bulk substrates are not compatible with SOI substrates. For example, the thin silicon surface layer of SOI substrate presents various challenges to introduce SCR-based ESD protection circuit in SOI substrate.

From the foregoing discussion, it is desirable to provide SCR-based ESD protection circuit which is compatible with complementary metal oxide semiconductor (CMOS) applications using SOI substrate. It is also desirable to have an ESD protection circuit integral within the IC to effectively protect sensitive input and/or output circuits from an ESD event.

SUMMARY

Embodiments generally relate to silicon controlled rectifier (SCR)-based ESD protection integrated devices and methods for forming such devices. More particularly, the present disclosure relates to silicon-on-insulator (SOI) integrated SCR-based ESD devices. The embodiments protect devices during an ESD event. Specifically, they eliminate floating body effect, minimize leakage, and reduce power consumption during standby. In addition, the process disclosed is low cost and highly compatible with CMOS/SOI process.

In one embodiment, a method for forming a device is disclosed. The method includes providing a crystalline-on-insulator substrate having a bulk substrate and a surface substrate separated by a buried insulator layer. The surface substrate is defined with a device region for accommodating an ESD protection device. An ESD protection device is formed in the device region. A device isolation region surrounding the device region is formed in the surface substrate. A first well and a second well are formed in the surface substrate. The first well includes first polarity type dopants and defines a first portion (FP) and the second well includes second polarity type dopants and defines a second portion (SP) of the ESD protection device and the first well abuts the second well. At least a first shallower isolation region is formed in the FP and a second shallower isolation region is formed in the SP. A shallower isolation region includes a second depth which is shallower than a first depth of the device isolation region. First and second FP contact regions are formed in the FP and first and second SP contact regions are formed in the SP. The first FP and second SP contact regions include the first polarity type dopants while the second FP and first SP contact regions include the second polarity type dopants. The second SP contact region, the SP well and the FP well form a first junction transistor while the second FP contact region, the FP well and the SP well form a second junction transistor of the ESD protection device.

In another embodiment, a device is presented. The device includes a crystalline-on-insulator substrate having a bulk substrate and a surface substrate separated by a buried insulator layer. The surface substrate is defined with a device region for accommodating an ESD protection device. An ESD protection device is disposed in the device region. The ESD protection device includes a device isolation region surrounding the device region in the surface substrate. A first well and a second well are disposed in the surface substrate. The first well includes first polarity type dopants and defines a first portion (FP) and the second well includes second polarity type dopants and defines a second portion (SP) of the ESD protection device and the first well abuts the second well. At least a first shallower isolation region is disposed in the FP and a second shallower isolation region is disposed in the SP. A shallower isolation region includes a second depth which is shallower than a first depth of the device isolation region. First and second FP contact regions are disposed in the FP and first and second SP contact regions are disposed in the SP. The first FP and second SP contact regions include the first polarity type dopants while the second FP and first SP contact regions include the second polarity type dopants. The second SP contact region, the SP well and the FP well form a first junction transistor while the second FP contact region, the FP well and the SP well form a second junction transistor of the ESD protection device.

These and other advantages and features of the embodiments herein disclosed will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-2c show top and cross-sectional views of an embodiment of a SCR-based ESD protection device.

FIGS. 4a-4h, FIGS. $4i_1$-$4i_2$, FIGS. $4j_1$-$4j_2$ and FIGS. $4k_1$-$4k_2$ show an embodiment of a process for forming a SCR-based ESD protection device of which figures with subscript 1 show cross-sectional views taken along A-A' of FIG. 2a while figures with subscript 2 illustrate cross-sectional views taken along B-B' of FIG. 2a.

DETAILED DESCRIPTION

Embodiments generally relate to semiconductor devices. In one embodiment, the devices include an ESD protection circuit. The ESD protection circuit, for example, is activated during an ESD event to dissipate ESD current. The device may include a SCR-based ESD protection circuit. The devices, for example, may be any type of semiconductor devices, such as integrated circuits (ICs). The ICs, for example, may be any suitable ICs used for radio frequency (RF) applications. Other types of ICs may also be useful. The ICs can be incorporated into or used with, for example, electronic products, computers, cell phones, and personal digital assistants (PDAs). The devices may also be incorporated into other types of products.

Figure 1:
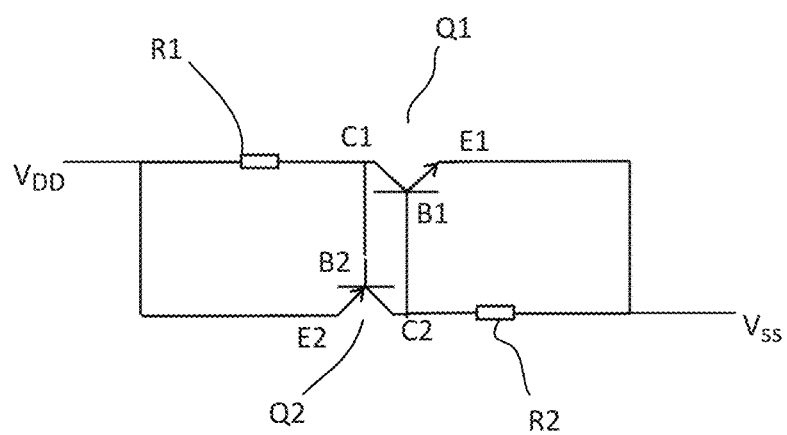
FIG. 1 shows a simplified schematic diagram of a SCR-based ESD protection circuit.

FIG. 1 shows a simplified schematic diagram of a portion of an embodiment of an ESD protection circuit 100. The ESD protection circuit, in one embodiment, is a silicon control rectifier (SCR) based ESD circuit. The SCR-based ESD protection circuit is connected between a pad, such as I/O pad, and a device to be protected (not shown) by the SCR-based ESD protection circuit during an ESD event. The SCR-based ESD circuit includes first and second terminals. The first terminal is coupled to a first source and the second terminal is coupled to a second source. In one embodiment, the first source is a high power source and the second source is a low power source. The low power source, in one embodiment, is $V_{SS}$ or ground. The first terminal of the SCR-based ESD circuit is coupled to a pad which is coupled to the high power source, such as $V_{DD}$. An ESD event, such as an ESD zap or pulse, triggers or activates the SCR-based ESD protection circuit to create a current path between the pad to ground to dissipate the ESD current.

Referring to FIG. 1, the SCR-based ESD protection circuit is a PNPN-based structure. The ESD protection circuit 100, as shown, includes a first junction transistor Q1 and a second junction transistor Q2. For example, the first transistor Q1 is a NPN transistor having a first emitter terminal E1, a first collector C1 and a first base B1. As for the second transistor Q2, it is a PNP transistor having a second emitter terminal E2, a second collector C2 and a second base B2. The ESD protection circuit also includes a first resistor R1, which is the parasitic resistance of a first well (e.g., N-type well), and a second resistor R2 formed by the parasitic resistance of a second well (e.g., P-type well) as will be described in FIGS. 2a-2c and FIGS. 3a-3c later.

In one embodiment, the first collector terminal C1 of Q1 is coupled to the high power source $V_{DD}$ via the first resistor R1 while the first emitter terminal E1 is coupled to the low power source or $V_{SS}$. The second emitter terminal E2 of Q2 is coupled to the high power source $V_{DD}$ while the second collector terminal C2 is coupled to the low power source or $V_{SS}$ via the second resistor R2. The base B1 is coupled to a first node, which is common to R2 and C2 while the base B2 is coupled to a second node, which is the common terminal between R1 and C1. The various terminals and nodes of the transistors shown in FIG. 1 correspond to various doped or contact regions and wells of the ESD protection circuit, as will be described in detail in FIGS. 2a-2c and FIGS. 3a-3c later.

Figure 2A:
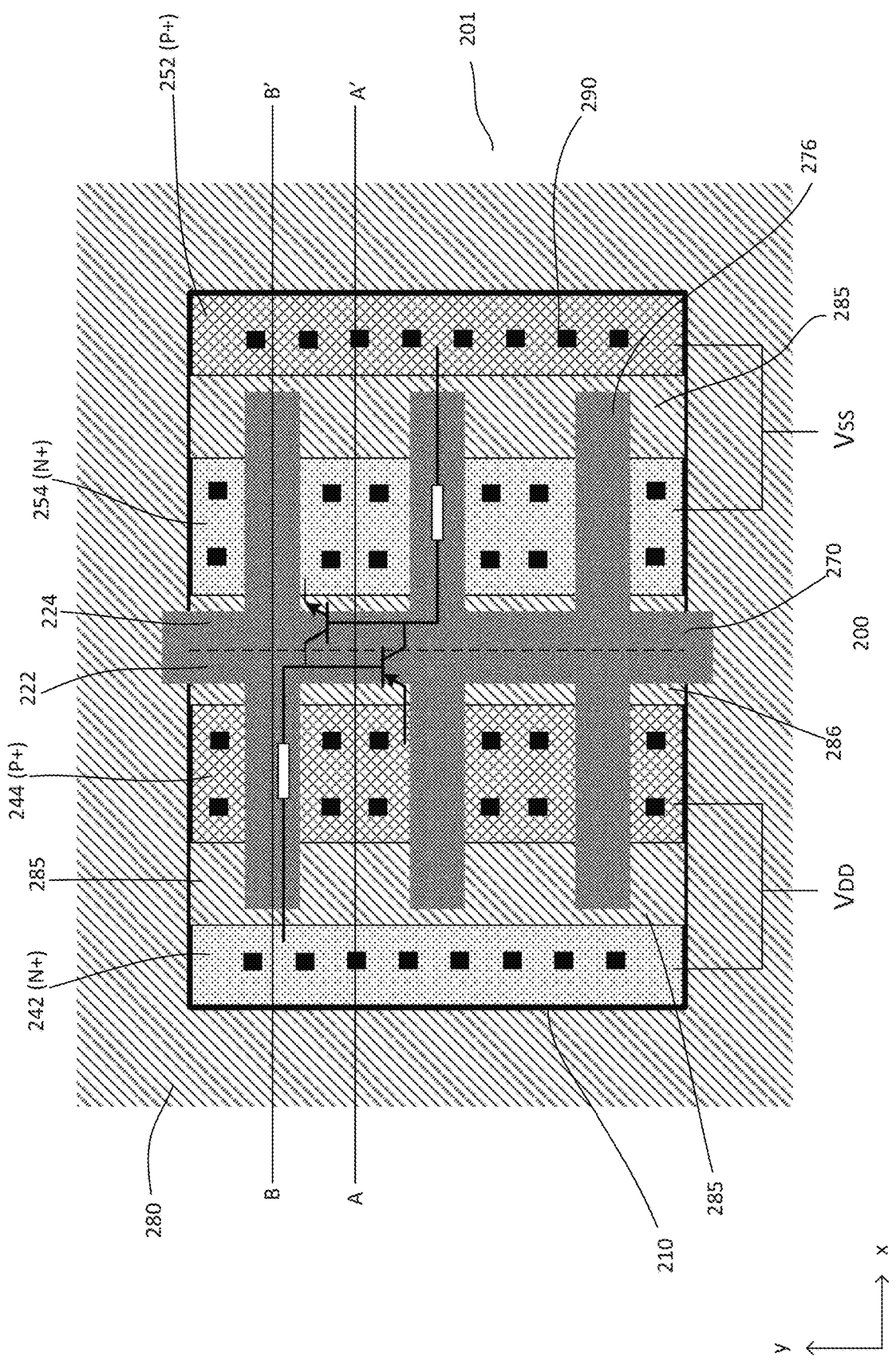
Figure 2C:
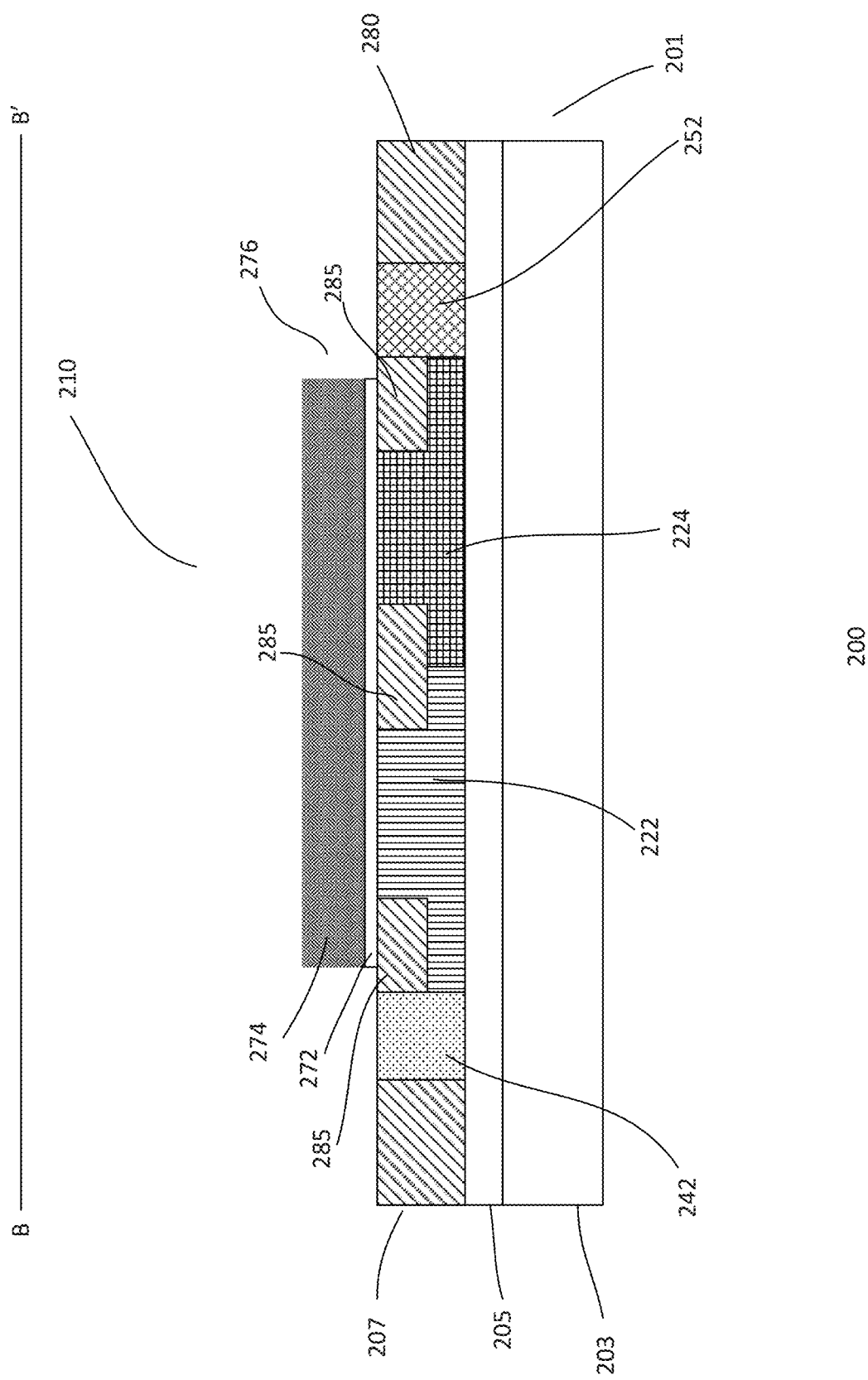

FIGS. 2a-2c show various views of an embodiment of an ESD protection device 200. For instance, FIG. 2a shows a top view of the device, FIG. 2b shows a cross-sectional view taken along A-A' and FIG. 2c shows a cross-sectional view taken along B-B' of the device. The device, for example, is an IC. Other types of devices may also be useful. The various doped or contact regions and wells of the device shown in FIGS. 2a-2c correspond to the various terminals of the ESD protection circuit described in FIG. 1. Common elements may not be described or described in detail.

As shown, the device 200 includes a substrate 201. The substrate, in one embodiment, is a crystalline-on-insulator (COI) substrate. A COI substrate includes a support or bulk substrate 203, an insulator layer 205, and a top or surface substrate 207. In one embodiment, the COI substrate is a silicon-on-insulator (SOI) substrate. The SOI substrate includes a silicon bulk substrate, and a silicon surface substrate separated by an insulator layer. Other types of COI substrates may also be useful. It is understood that the surface and bulk substrates need not be formed of the same material. The insulator layer 205 may be a silicon oxide insulator layer. The insulator layer, for example, may be referred to as a buried insulator layer, such as a buried oxide (BOX) layer. Other suitable types of dielectric insulating materials may also be useful. The thickness of the insulator layer 205 may be about 0.1-1 μm. For example, the thickness of the insulator layer is about 0.4 μm. As for the top surface substrate or layer 207, it may be about 0.05-0.2 μm thick. For example, the thickness of the top surface substrate is about 0.16 μm. Other suitable thicknesses for the insulator layer and surface substrate may also be useful.

The device 200 may include doped regions and wells disposed in the surface substrate 207 having different dopant concentrations. For example, the device may include heavily doped ($x^+$), intermediately doped (x) and lightly doped ($x^-$) regions, where x is the polarity type which can be p or n. A lightly doped region may have a dopant concentration of about 1E11-1E13/cm$^2$, an intermediately doped region may have a dopant concentration of about 1E13-E15/cm$^2$, and a heavily doped region may have a dopant concentration of about 1E15-1E17/cm$^2$. Providing other dopant concentrations for the different doped regions may also be useful, for example, depending on the breakdown voltage requirement. P-type dopants may include boron (B), aluminum (Al), indium (In) or a combination thereof, while n-type dopants may include phosphorous (P), arsenic (As), antimony (Sb) or a combination thereof.

As illustrated in FIGS. 2a-2c, the device 200 includes a device region 210 to accommodate the ESD protection circuit or device on the surface substrate 207. The device region 210 is isolated from other device regions (not shown) by a device isolation region 280. For example, the device may also include other device regions to accommodate different voltage transistors, such high voltage (HV), intermediate voltage (IV) and low voltage (LV) devices as well as other types of devices, such as memory devices. The device isolation region 280, for example, may surround the device region 210 which accommodates the ESD protection circuit. For example, the device region 210 is disposed within the device isolation region 280. In one embodiment, the device isolation region 280 is a shallow trench isolation (STI) region. Other types of isolation regions may also be employed. The STI region may include a trench filled with a dielectric material, such as silicon oxide. A dielectric trench liner may be provided to line the trench of the device isolation region. The device isolation region 280, in one embodiment, is a STI region that extends at least the depth or thickness of the surface substrate 207. For instance, the device isolation region 280 is a normal STI region that extends from the top surface of the surface substrate 207 towards and touches or in direct contact with the insulator layer 205.

In one embodiment, the device region 210 also includes internal isolation regions (or shallower isolation regions) 285 or 286. The shallower isolation regions 285 and 286 are disposed within the device isolation region 280. The shallower isolation regions 285 and 286 may be a STI region similar to the device isolation region 280. For example, the shallower isolation region includes an isolation trench lined with an oxide liner and is filled with silicon oxide. Other suitable types of isolation regions may also be useful for the shallower isolation region. In one embodiment, the shallower isolation regions 285 and 286 include a depth shallower than the depth of the device isolation region 280. The shallower isolation regions 285 and 286, for example, are about half the depth or thickness of the surface substrate layer 207 and do not touch the buried insulator layer 205. Other suitable depth dimensions for the shallower isolation region may also be useful as long as it does not touch the buried insulator layer.

The device 200, in one embodiment, is a SCR-based ESD protection circuit or device. In one embodiment, the SCR-based ESD circuit includes a first portion (FP) and a second portion (SP) disposed in the device region 210. The first and second portions are disposed along a length or x-direction of the device region. For example, a portion occupies the complete width along the y-direction of the device region, with both portions occupying the complete length of the device region. For example, the FP and SP each occupies about half the device region and abut in the device region. The portions serve as terminal portions of the ESD protection device. For example, the first portion serves as a first terminal and the second portion serves as a second terminal of the ESD protection device. In one embodiment, the first terminal provides coupling to a pad which couples to the high power or voltage source, such as $V_{DD}$, and the second terminal portion provides coupling to the low power or voltage source, such as $V_{SS}$ or ground. Other configurations of the portions may also be useful.

The first portion includes a first portion (FP) device well 222 formed in the surface substrate 207. The FP well 222 includes first polarity type dopants. The first polarity type, in one embodiment, is N-type. For example, the FP well is a lightly doped N-type well. The second portion includes a second portion (SP) device well 224 formed in the surface substrate 207. The SP well 224, in one embodiment, includes second polarity type dopants. The second polarity type is of the opposite polarity type as, for example, the FP well. The SP well, in one embodiment, is a lightly doped P-type well. The FP and SP wells may be lightly doped device wells. For example, the dopant concentration of the FP and SP wells is about $5E12-5E13/cm^2$. Other suitable dopant concentrations may also be useful. The FP device well abuts the SP device well (as shown by dotted line) and the wells encompass the whole device region within the device isolation region 280.

The first portion includes first and second FP doped or contact regions 242 and 244 while the second portion includes first and second SP doped or contact regions 252 and 254. A doped or contact region, for example, is disposed in a respective portion of the device region and extends or traverses along the width of the device region in the y-direction. For example, a contact region extends the complete width of the device region. Adjacent contact regions are disposed in the device region in the length or x-direction. The doped or contact regions, in one embodiment, are heavily doped contact regions. The dopant concentration of the contact regions may be about $1E14-1E16/cm^2$. Other suitable dopant concentrations may also be useful.

The first FP contact region 242 is a heavily doped contact region disposed near the outer edge of FP and distal from SP of the device region. The second FP contact region 244 is a heavily doped contact region disposed in the FP and near the midline proximal to the SP of the device region. In one embodiment, the first FP contact region 242 is of the same polarity type as its respective FP well 222 and the second FP contact region 244 is of the opposite polarity type as its respective FP well. In one embodiment, the first FP contact region is a first polarity type contact region while the second FP contact region is a second polarity type contact region. For example, the first FP contact region 242 may be a heavily doped N-type (N+) contact region and the second FP contact region 244 may be a heavily doped P-type (P+) contact region. The first and second FP contact regions serve as contact regions which provide coupling to a pad. The pad is an I/O pad and is coupled to a high voltage source, such as $V_{DD}$.

The first FP contact region 242, for example, serves as a body contact region for providing connection to the body of a junction transistor of the ESD device. The first FP contact region, for example, is a heavily doped region with first polarity type dopants for biasing the FP well 222 (or N well). The dopant concentration of the body contact region may be about the same as the dopant concentration of the first polarity type S/D regions of other devices (not shown) and the depth of the body contact region may be about the same as the depth of these S/D regions. The first FP contact region, for example, extends to a depth which touches the insulator layer 205. As shown, an internal isolation region or shallower isolation region 285 which is disposed in FP traverses or extends along the y-direction separates the first FP contact region 242 from the second FP contact region 244 in the x-direction. In one embodiment, the shallower isolation region 285 having a shallower depth allows the first FP contact region 242 to connect with the FP well 222 which serves as body of a junction transistor by a portion of the FP well beneath the shallower isolation region 285 in FP.

The second portion includes first and second SP contact regions 252 and 254. The first SP contact region 252 is a heavily doped contact region disposed near the outer edge of SP and distal from FP of the device region. The second SP contact region 254 is a heavily doped contact region disposed in the SP and near the midline proximal to the FP of the device region. In one embodiment, the first SP contact region 252 is of the same polarity type as its respective SP well 224 and the second FP contact region 254 is of the opposite polarity type as its respective SP well. In one embodiment, the first SP contact region is a second polarity type contact region while the second SP contact region is a first polarity type contact region. For example, the first SP contact region 252 may be a heavily doped P-type (P+) contact region and the second SP contact region 254 may be a heavily doped N-type (N+) contact region. The first and second SP contact regions serve as contact regions for the second terminal of the ESD protection device. For example, the first and second SP contact regions are coupled to a low voltage source, such as $V_{SS}$ or ground.

The first SP contact region 252, for example, serves as a body contact region for providing connection to the body of another junction transistor of the ESD protection device. The first SP contact region, for example, is a heavily doped region with second polarity type dopants for biasing the SP well 224 (or P well). The dopant concentration of the body contact region may be about the same as the dopant concentration of the second polarity type S/D regions of other devices (not shown) and the depth of the body contact region may be about the same as the depth of these S/D regions. The second FP contact region, for example, extends to a depth which touches the insulator layer 205. As shown, an internal isolation region or shallower isolation region 285 which is disposed in SP traverses or extends along the y-direction separates the first SP contact region 252 from the second SP contact region 254 in the x-direction. In one embodiment, the shallower isolation region 285 having a shallower depth allows the first SP contact region to connect with the SP well 224 which serves as body of another junction transistor by a portion of the SP well beneath the shallow isolation region 285 in SP.

A gate structure is disposed over the surface substrate 207. The gate structure includes a vertical gate 270 and one or more horizontal gates over the surface substrate. The gate structure includes a gate dielectric 272 and a gate electrode 274. The gate dielectric includes silicon oxide and the gate electrode includes polysilicon. Other suitable types of gate dielectric and electrode materials may also be useful. The vertical gate 270 is disposed in between FP and SP and extends along the width or y-direction. For example, the vertical gate 270 extends the complete width of the device region when viewed from top. The vertical gate 270, for example, may be used to define the second FP contact region 244 and the second SP contact region 254 during processing as will be described later. The gate structure also includes one or more horizontal gates 276 which extend along the length or x-direction. The one or more horizontal gates 276, for example, block and protect the FP well 222 and SP well 224 underneath from the heavily P or N dopant implantation, which allow the FP well 222 to be connected to the first FP contact region 242 in FP, and the SP well 224 to the first SP contact region 252 in SP, respectively, as shown in FIG. 2c.

In one embodiment, an internal isolation region or a shallower isolation region 286 which extends and traverses along the width or y-direction is disposed below the vertical gate 270. The shallower isolation region 286 under the gate 270, for example, has about the same width as the gate 270. Alternatively, the shallower isolation region 286 under the gate 270 may have a width slightly larger than the width of the gate 270 to better optimize the device performance. The shallower isolation region 286 under the gate 270 isolates the second FP contact region 244 from the second SP contact region 254. As shown, a junction formed by the abutment of the FP well 222 and SP well 224 is disposed below the shallower isolation region 286 under the gate 270.

As shown in FIGS. 2a-2c, the FP well (or N well) 222 and the SP well (or P well) 224 abut between the first and second portions and form an NP junction in the middle, which is the only junction that is reverse biased, and very critical in a SCR device. The second SP contact region (or N+ region) 254, the P-well 224 and the N well 222 form the first junction transistor Q1 of the SCR-based ESD protection circuit as shown in FIG. 1. The first junction transistor Q1, for example, is a NPN transistor. In such configuration, the N+ region 254 serves as the emitter E1, the P well 224 serves as the base B1 and the N well 222 serves as the collector C1 of the first NPN transistor Q1. The second FP contact region (or P+ region) 244, the N well 222 and the P well 224 form the second junction transistor Q2 of the SCR-based ESD protection circuit of FIG. 1. For example, the P+ region 244, the N well 222 and the P well 224 form the second PNP transistor Q2. In such configuration, the P+ region 244 serves as the emitter E2, the N well 222 serves as the base B2 and the P well 224 serves as the collector C2 of the second PNP transistor Q2. Thus, the SCR-based ESD protection device has a structure of two junction transistors in a PNPN configuration. The first resistor R1 corresponds to the parasitic resistance of the FP well while the second resistor R2 corresponds to the parasitic resistance of the SP well. A plurality of contact plugs 290 are disposed over the various doped regions of the ESD protection device as shown in FIG. 2a. The contact plugs disposed over the FP contact regions 242 and 244, for example, provide electrical connection between these contact regions to the high voltage source, such as $V_{DD}$. The contact plugs disposed over the SP contact regions 252 and 254, for example, provide electrical connection between these contact regions to the low voltage source, such as $V_{SS}$ or ground.

Figure 3A:
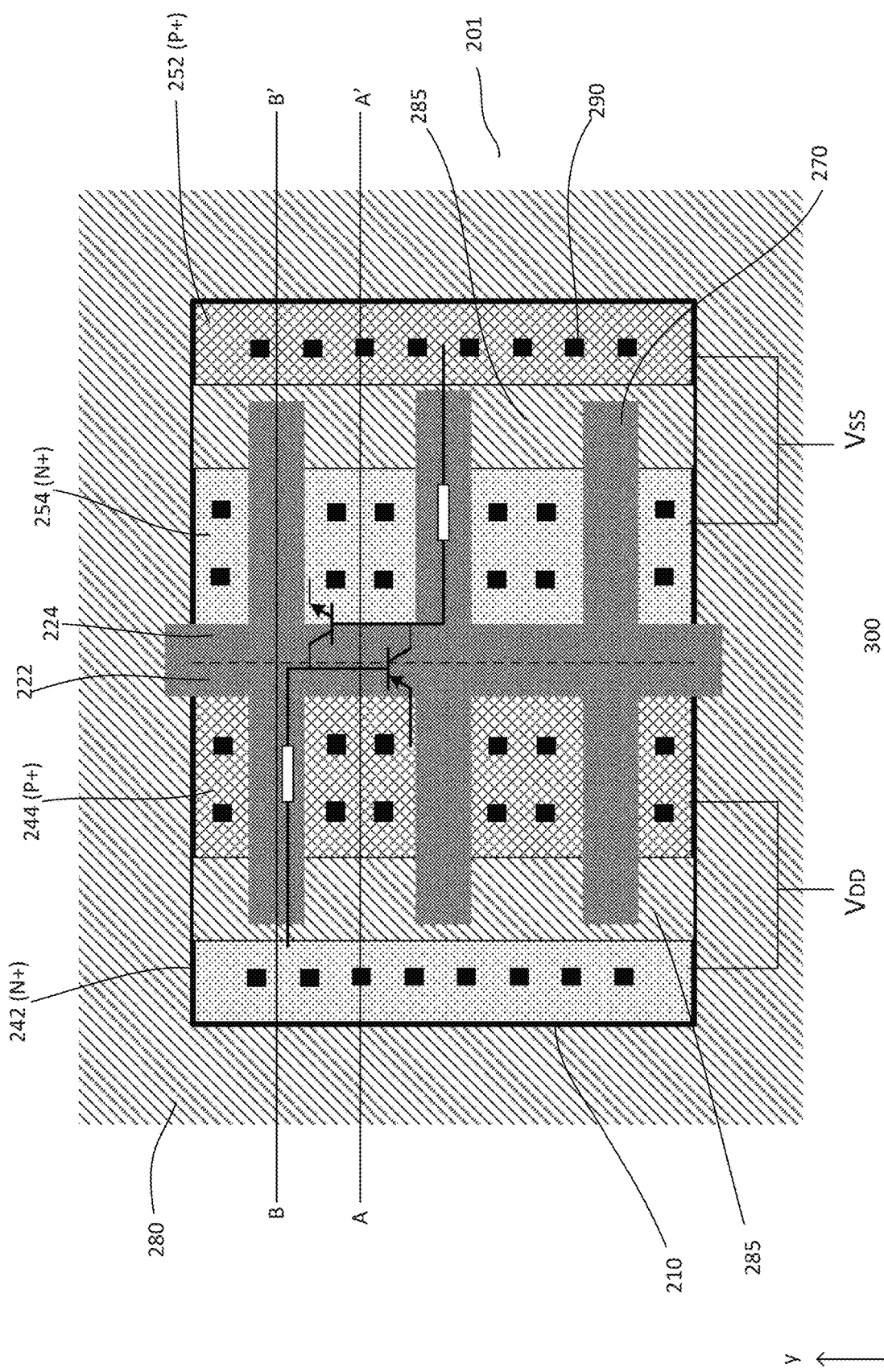
FIGS. 3a-3c show top and cross-sectional views of another embodiment of a SCR-based ESD protection device.
Figure 3B:
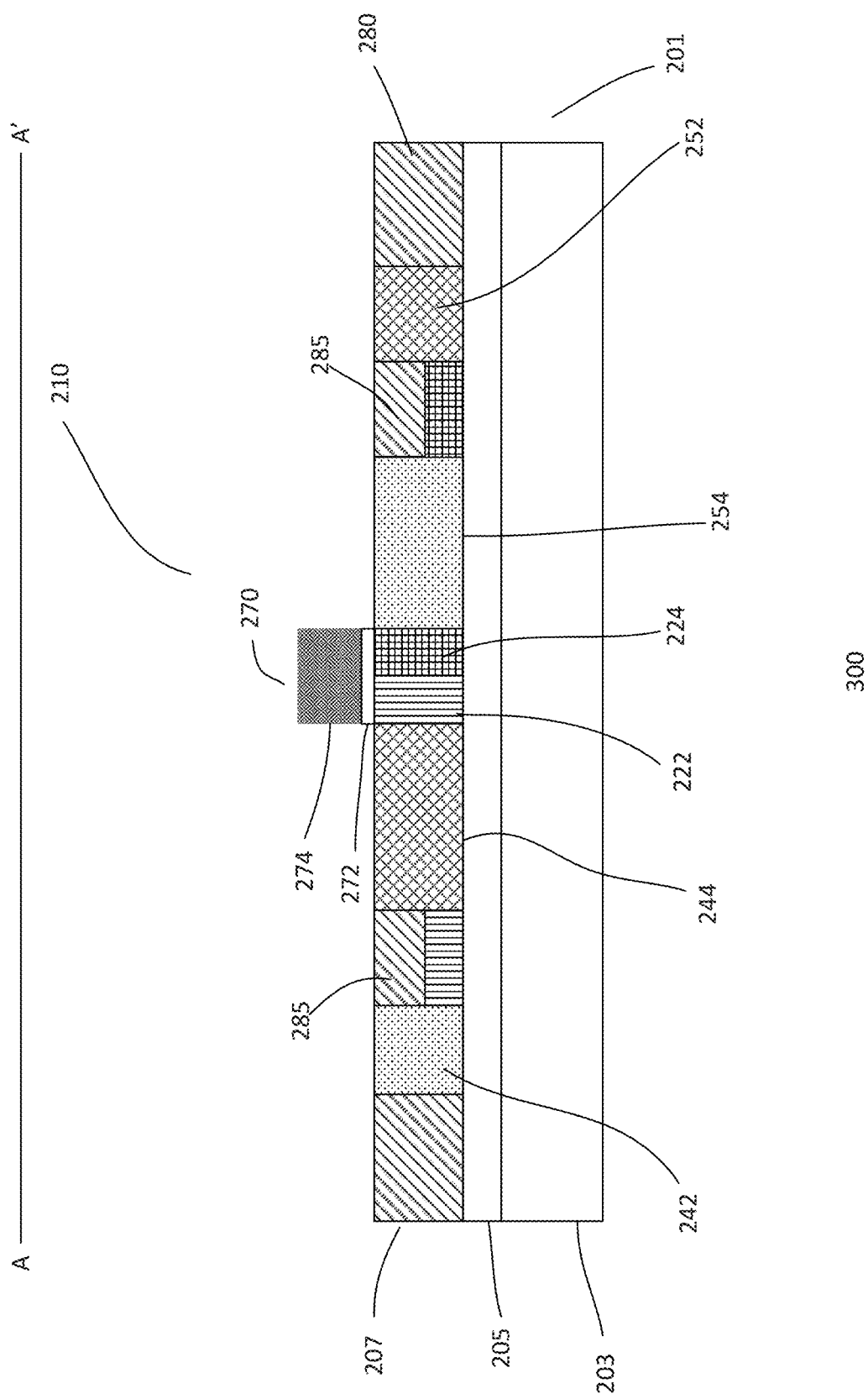
Figure 3C:
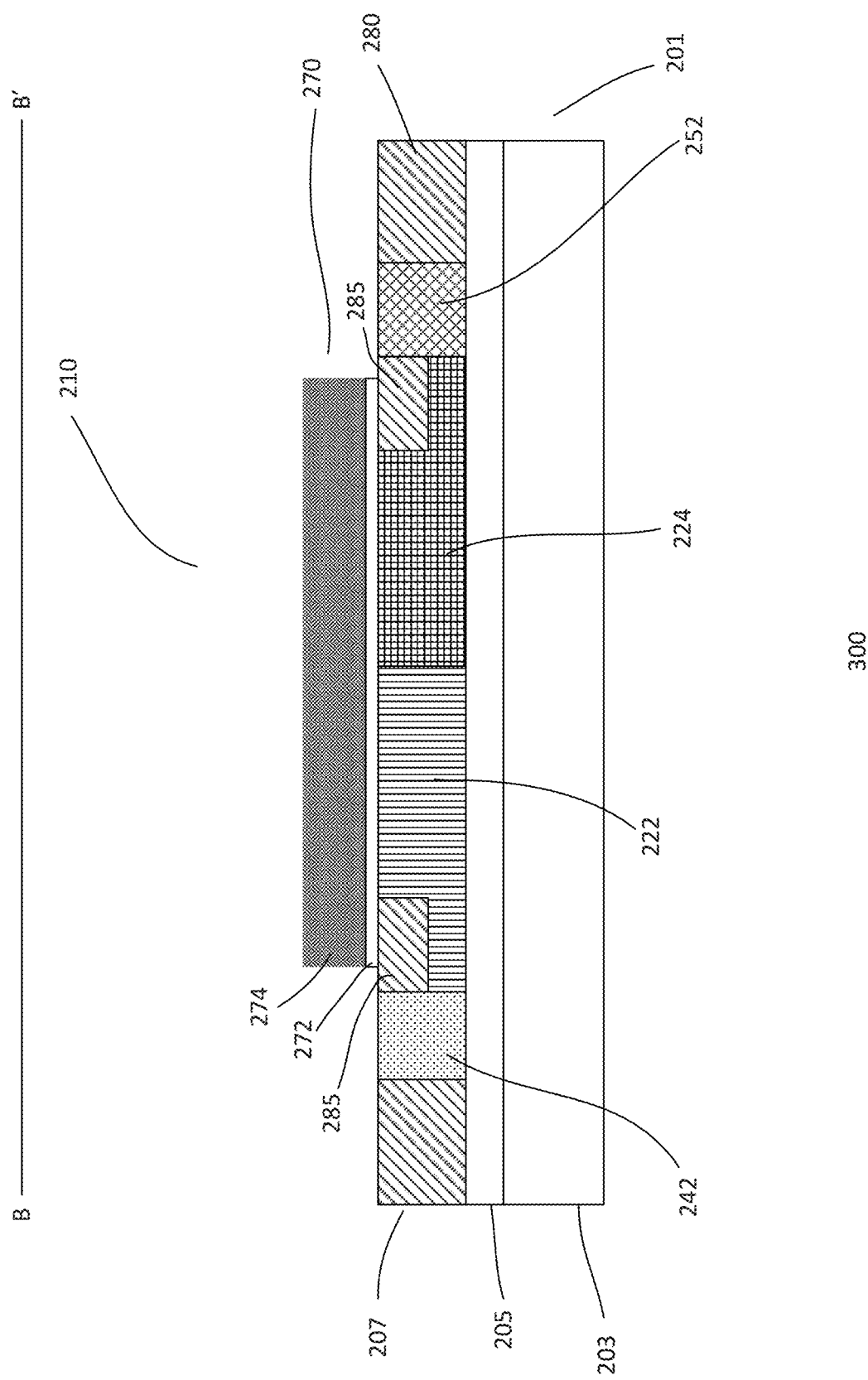

FIGS. 3a-3c show various views of another embodiment of a device 300. For instance, FIG. 3a shows a top view of the device, FIG. 3b shows a cross-sectional view taken along A-A' and FIG. 3c shows a cross-sectional view taken along B-B' of the device. The device 300 is similar to the device 200 described and shown in FIGS. 2a-2c and the various doped or contact regions and wells of the device 300 correspond to the various terminals of the ESD protection circuit described in FIG. 1. Common elements and features having the same reference numerals may not be described or described in detail. In the interest of brevity, the description of the device 300 below primarily focuses on the difference(s) compared with the device 200 shown in FIGS. 2a-2c.

Referring to FIGS. 3a-3c, the device 300 differs from the device 200 in that no internal isolation region (or shallower isolation region) is disposed below the vertical gate 270. In such configuration, the N well 222 and the P well 224 may abut and form the NP junction directly under the gate 270 as shown in FIGS. 3b-3c.

During an ESD event, such as an ESD zap or pulse, the ESD protection device 200 or 300 will be activated to create a current path between the pad to ground to dissipate the ESD current. As shown above, triggering voltage for breaking down NP junction is controlled by distance between the P+ and N+ contact regions 244 and 254. During an ESD event, breaking down the NP junction creates latch-up in SCR protection mode. During standby condition when there is no ESD event, SCR latch-up is not required and the reverse biased NP junction acts as a high resistance to minimize DC leakage current.

The ESD protection devices 200 and 300 as described above provide various advantages. The SCR-based ESD structure as disclosed forms a usable ESD protection device in a COI or SOI substrate. In traditional bulk CMOS process, bulk substrate with sufficient thickness allows wiring-outs for the N well and P well. In COI or SOI substrate, the surface substrate 207 of the SOI substrate is relatively thin. The formation of P+ or N+ body contact regions normally occupies all the thickness of the thin surface substrate. Thus, this makes it difficult for P well and N well to wire out. We have discovered that by providing internal isolation regions (or shallower isolation regions) having shallower depth adjacent to the P+ or N+ body contact regions in the ESD protection devices 200 and 300 allows the body contact regions to connect with the body or device well of the transistors in the SOI substrate for wiring out. Such configuration ensures that the doped or contact regions are properly connected to the respective power source to achieve an efficient and reliable SCR-based ESD protection device and to ensure that the structure is turned off during standby mode.

Further, the one or more horizontal gates 276 as described above may be used to protect N well and P well to be wired out. For illustration purpose, three horizontal gates are shown in the device 200 and 300. It is understood that any suitable numbers of horizontal gates may be provided to reduce resistance and the distance between adjacent horizontal gates may be adjusted to fine tune the ESD triggering voltage. The vertical gate 270 is used to form an abutted NP junction under the gate. The vertical gate defines N well, P well and NP junction. After processing, the vertical gate becomes useless for the device. The P+ contact region 244, N well 222, P well 224, and N+ contact region 254 constitute a PNPN SCR-based ESD protection circuit where the NP junction lies under the vertical gate.

In addition, the internal isolation region (or shallower isolation region) 286 disposed under the vertical gate adds additional advantage of preventing power leakage under the vertical gate. In conventional SCR-based ESD protection design having a gate over the NP junction, there tends to be a metal oxide silicon (MOS) channel between pad and ground. The current goes through N well if the gate voltage is tied low. The current goes through P well if the gate voltage is tied high. These cause parasitic PFET and NFET effect which creates constant high leakage during standby mode and consumes power. Device 200 alleviates the power consumption during standby. For instance, the shallower isolation region disposed under the vertical gate shown in device 200, which is about half the thickness of the insulator or BOX layer, is much thicker than the gate dielectric layer of the vertical gate. This eliminates the parasitic PFET and NFET effect and thus solves the high leakage problem.

FIGS. 4a-4k illustrate cross-sectional views of an embodiment of a process 400 for forming an ESD protection device. The device formed by process 400 is similar to that described in FIGS. 2a-2c and 3a-3c. Common elements may not be described or described in detail.

Figure 4A:
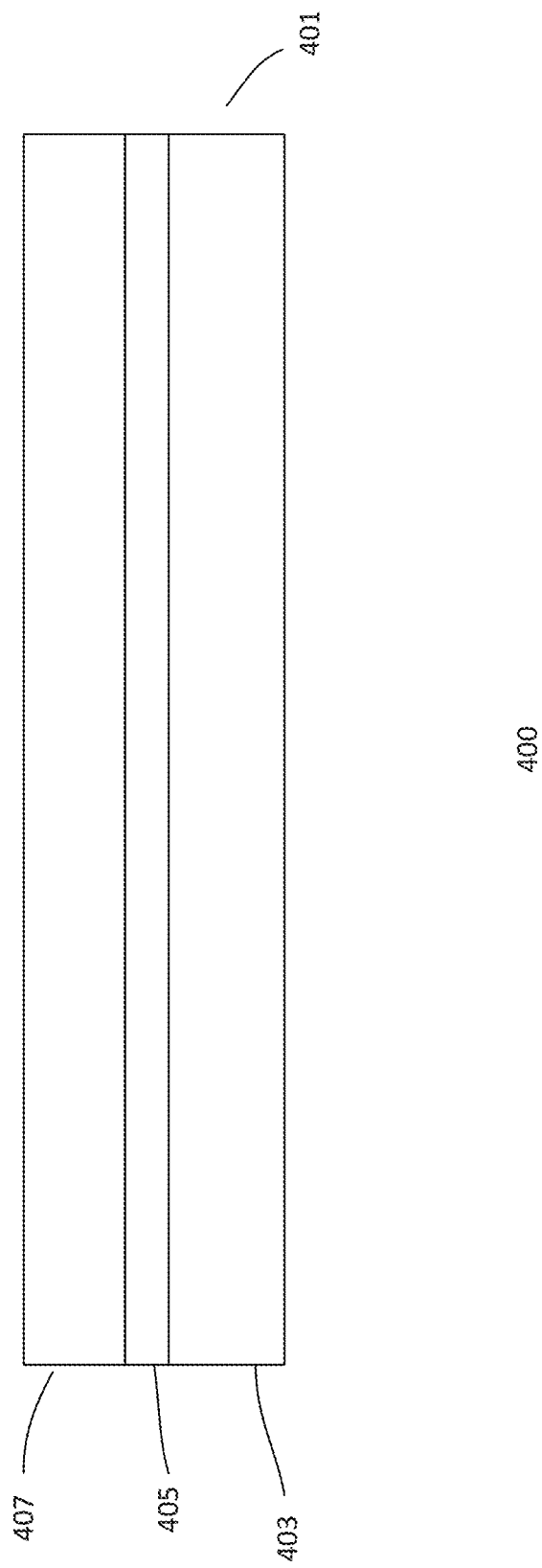

Referring to FIG. 4a, a substrate 401 is provided. In one embodiment, the substrate is a COI substrate with a buried insulator layer 405 disposed between a bulk substrate 403 and a surface substrate 407. In one embodiment, the COI substrate is a SOI substrate. For example, the bulk and surface substrates are silicon. Other types of COI substrates may also be useful. It is understood that the bulk and surface substrates need not be formed of the same material.

Figure 4B:
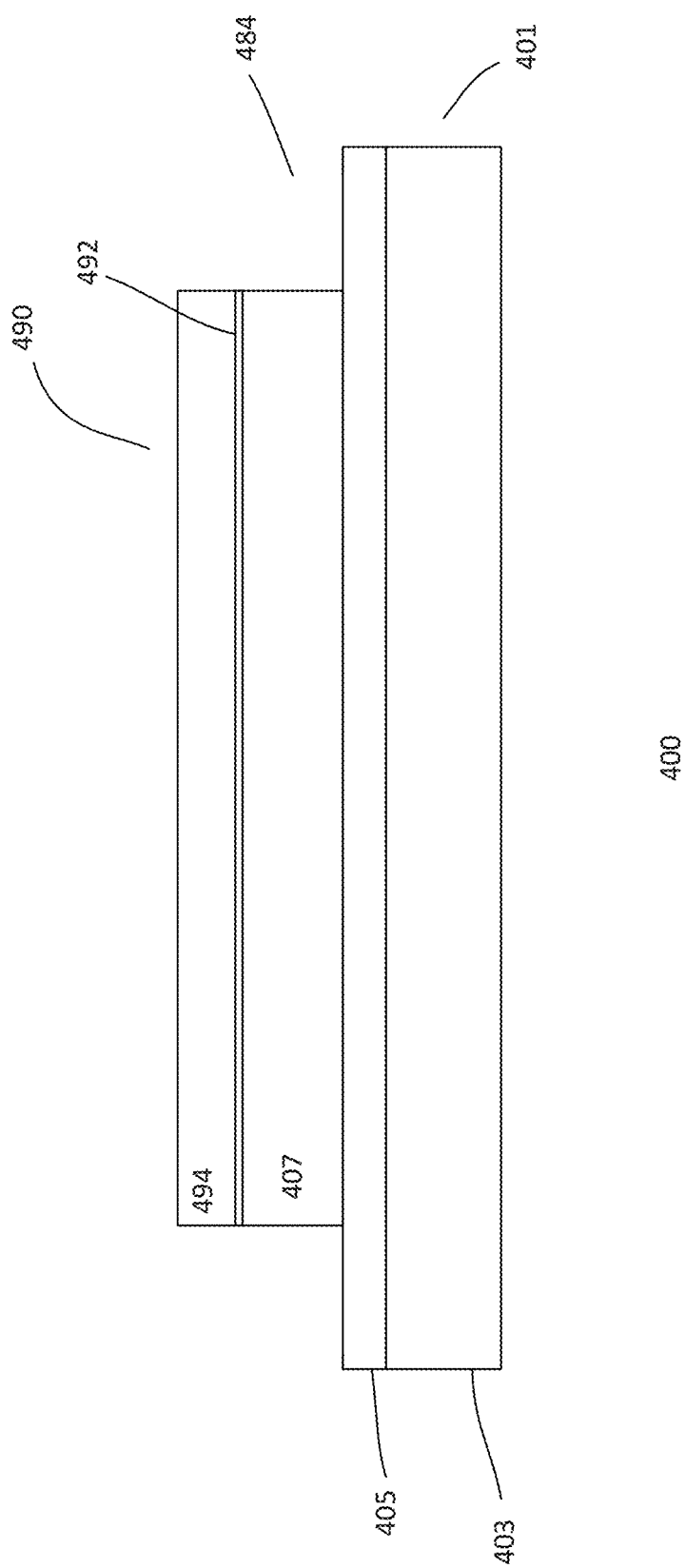

The process continues to define various isolation regions in the surface substrate 407. Referring to FIG. 4b, a hard mask layer 490 is disposed over the surface substrate. The hard mask layer, in one embodiment, includes a pad oxide layer 492 and a pad nitride layer 494. Other types of hard mask layers may also be useful. The pad oxide and pad nitride may be formed by thermal oxidation. Pad oxide enhances the adhesion between the surface substrate and pad nitride. Other pad oxide deposition procedures are also helpful. In one embodiment, the mask layer 490 is covered by a soft mask layer (not shown), such as a photoresist layer. To improve lithographic resolution, an anti-reflective coating (ARC) may be used below the photoresist layer. An exposure source may selectively expose the photoresist layer through a reticle containing the desired pattern. The photoresist is developed to transfer the pattern of the reticle to the soft mask. For example, developing the photoresist soft mask forms an opening corresponding to the device isolation region which surrounds a device region for accommodating a SCR-based ESD protection device.

The hard mask 490 is patterned by using the soft mask as described above. For example, an anisotropic etch, such as reactive ion etch (RIE) is performed. The etch removes portion of the hard mask exposed by the soft mask, exposing the surface substrate below. In one embodiment, the surface substrate portion corresponding to the device isolation region is exposed. Device isolation trench 484 is formed by etching the exposed portion of the surface substrate. The device isolation trench 484, in one embodiment, extends to the insulator layer 405. The soft mask may be removed after patterning the hard mask by, for example, ashing.

Figure 4C:
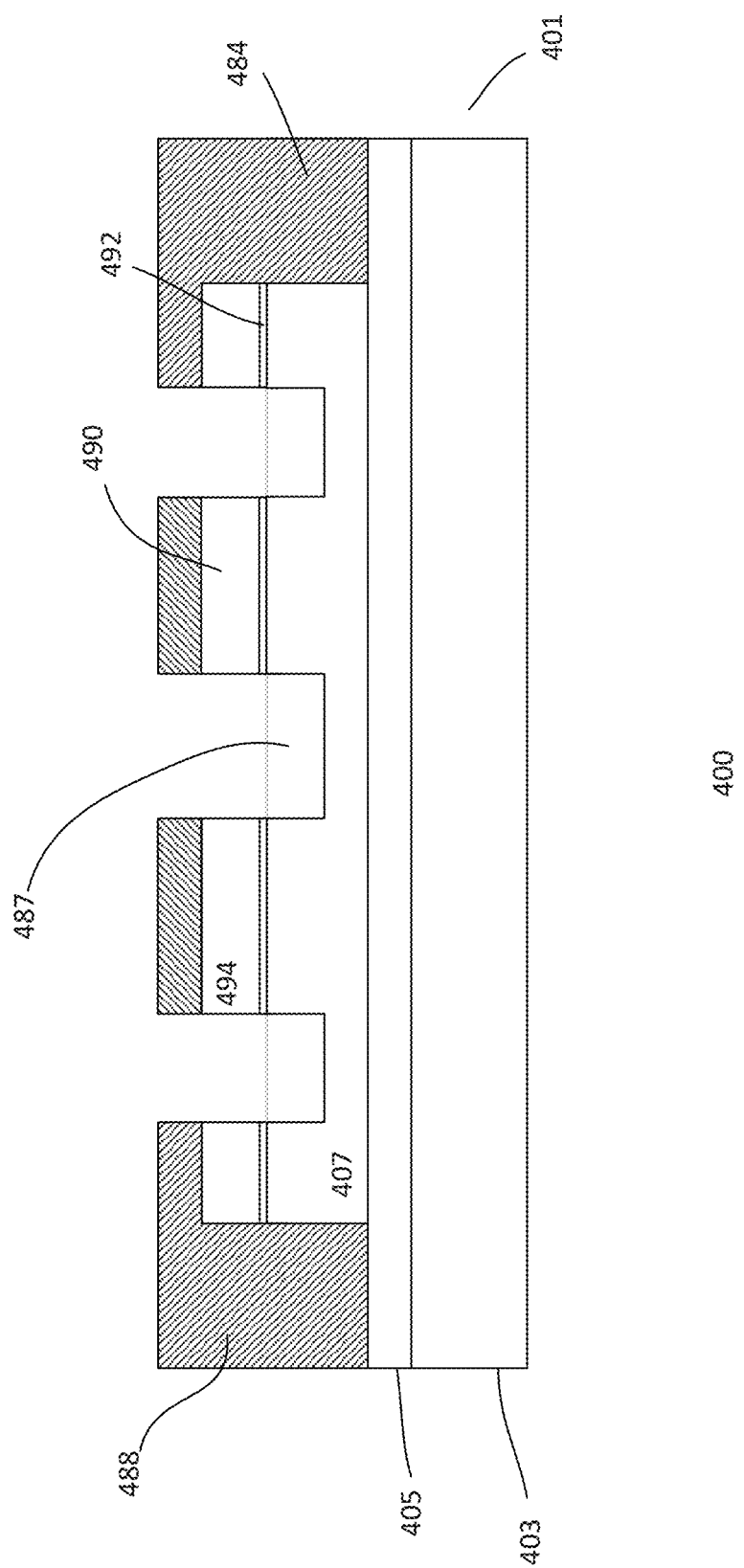

Referring to FIG. 4c, the surface substrate is processed to form internal isolation trenches 487 corresponding to the internal isolation regions (or shallower isolation regions). A soft mask layer 488, such as a photoresist layer, is formed over the hard mask 490 and fills the device isolation trenches 484. The photoresist is developed to form openings corresponding to the shallower isolation regions. In one embodiment, forming the internal isolation trenches 487 includes an anisotropic etch, such as RIE. As shown, patterning of the hard mask forms openings which expose location of a first internal isolation trench in the first portion (FP) and a second internal isolation trench in the second portion (SP). In one embodiment, patterning of the hard mask also forms an opening which exposes the location of a third internal isolation trench at about the midline between FP and SP. The internal isolation trenches 487, in one embodiment, extend about half the depth or thickness of the surface substrate 407. As shown, the soft mask 488 protects the device isolation trench 484 during formation of the internal isolation trenches. The soft mask may be removed after processing the surface substrate, for example, by ashing.

Figure 4D:
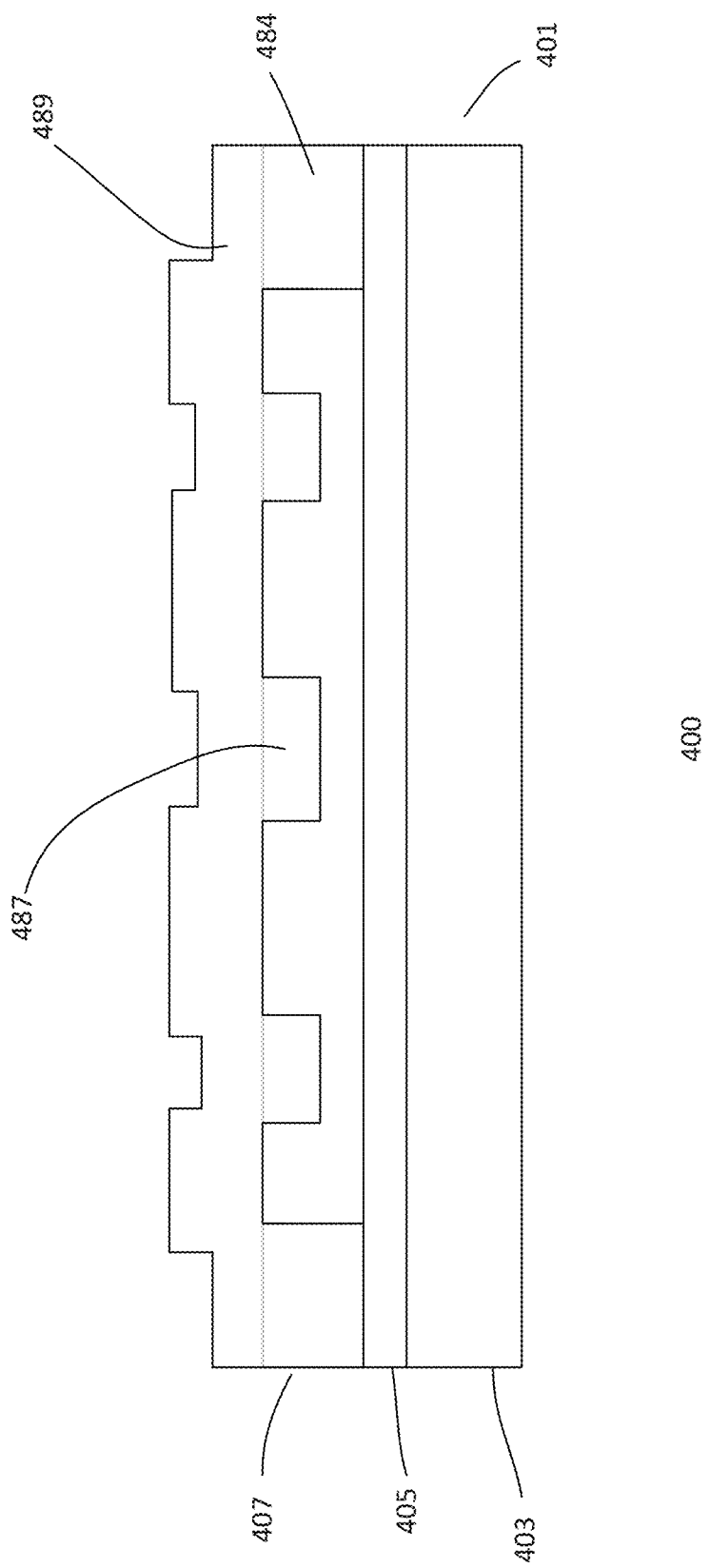

In FIG. 4d, the isolation trenches are filled with a dielectric material 489. Liners (not shown) may be formed in the trenches before the dielectric fill. After forming the liner, a dielectric fill layer 489 is formed. The dielectric fill layer fills the trenches and covers the surface substrate. The dielectric fill material, for example, may be silicon oxide or other useful insulating materials such as high aspect ratio process (HARP) layer and high density plasma silicon oxide (HDP) layer. The dielectric fill layer may be formed by chemical vapor deposition (CVD) or other suitable forming processes.

Figure 4E:
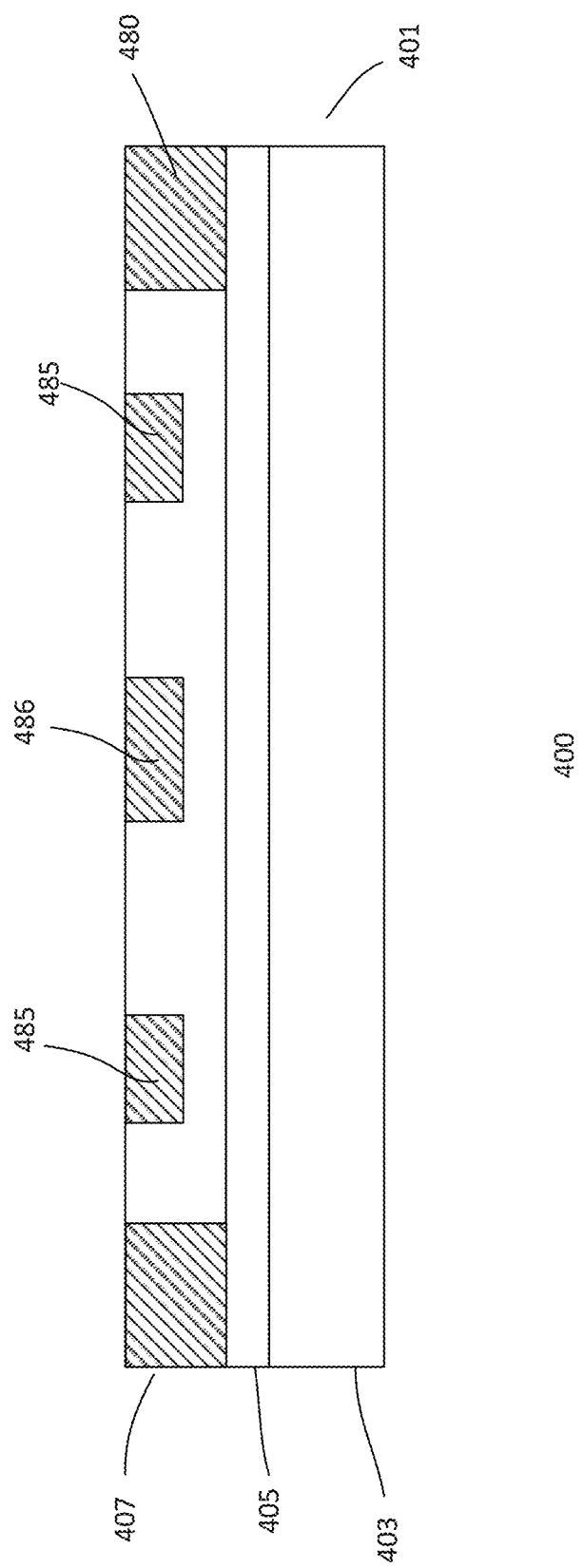

A planarization process is performed as shown in FIG. 4e. Planarizing the substrate removes excess dielectric fill and liner as well as the hard mask. The planarizing process, for example, includes a chemical mechanical polishing (CMP) process. The planarizing process provides a substantially planar top surface between top surfaces of the surface substrate 407, shallower isolation regions 485 and 486 and device isolation region 480. This forms the shallower isolation regions (shallower STI) 485 and 486 and device isolation region (normal STI) 480 having different depths. For example, the shallower isolation regions 485 and 486 has a shallower depth than the device isolation region 480.

Figure 4F:
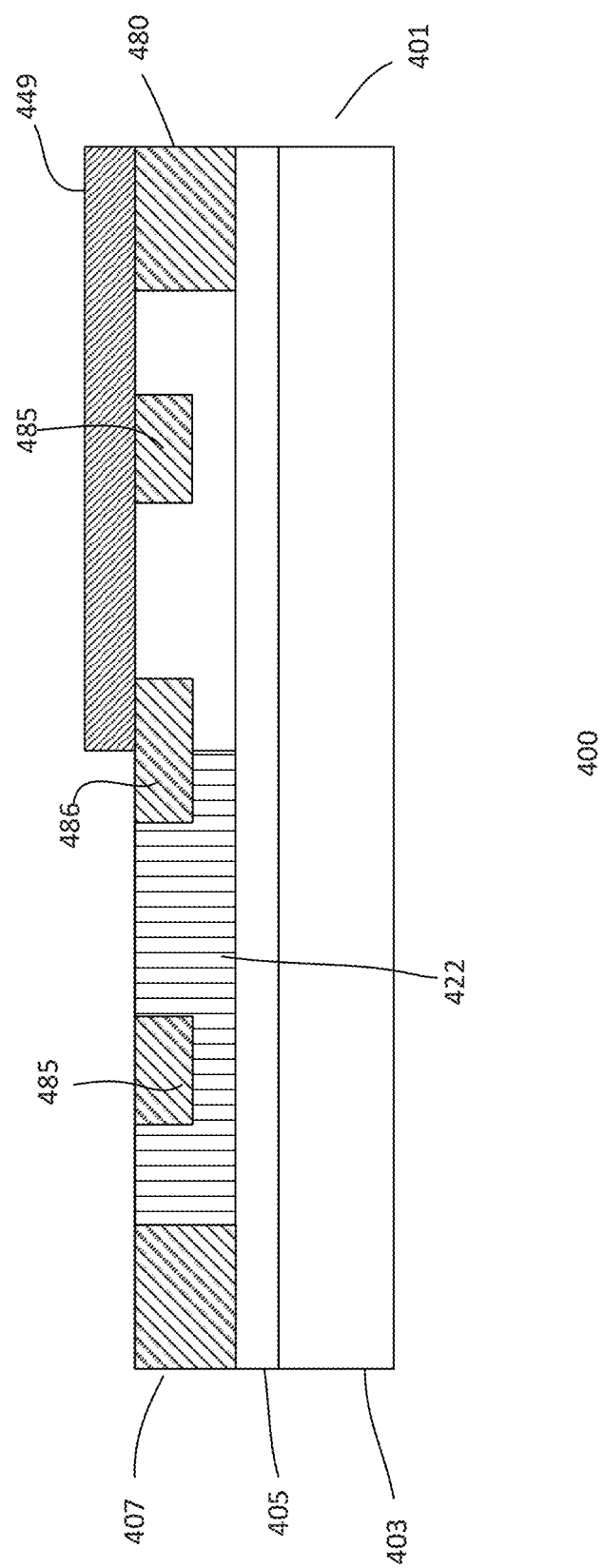

The process continues to form a first portion device well 422 (or FP well). As shown in FIG. 4f, an implant mask 449, such as a photoresist, is placed over about half of the device region. Implant mask covers and protects the second portion (SP) of device region during implantation. First polarity type dopants are implanted in the exposed portion of the surface substrate to form the FP well 422 in the first portion (FP). First polarity type dopants, for example, may be N-type and form an N well 422. The well implantation process is compatible with complementary metal oxide semiconductor (CMOS) process. For example, the implantation process to form the first polarity type FP well may be performed together while forming first polarity type device wells in other device regions (not shown) on the same substrate. The FP well (or N well), for example, extends laterally from a first inner edge of the device isolation region 480 adjacent to FP and extends under the first shallower isolation region 485 in FP and stops at about the midline of the device region. The implant mask 449 may be removed by, for example, ashing.

Figure 4G:
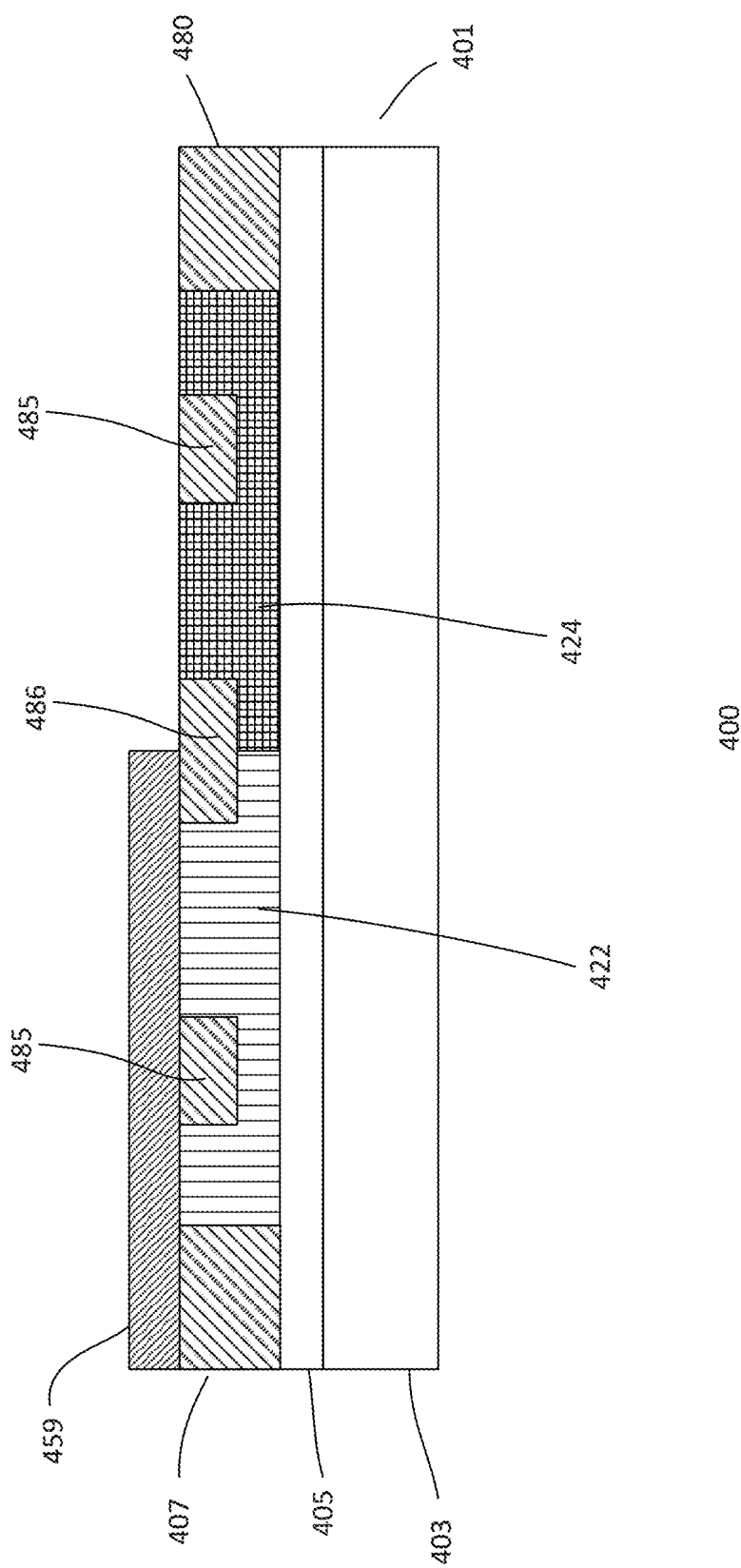

FIG. 4g shows the formation of a second portion device well 424 (or SP well). An implant mask 459, such as a photoresist, is placed over the first half of the device region. The implant mask covers and protects the first portion (FP) of device region during implantation. Second polarity type dopants are implanted in the second portion (SP) to form the SP well 424. Second polarity type dopants, for example, may be P-type and form a P well 424. The well implantation process is compatible with CMOS process. For example, the implantation process to form the SP well may be performed together while forming second polarity type device wells in other device regions (not shown) on the same substrate. The SP well (or P well) extends laterally from a second inner edge of the device isolation region adjacent to SP and extends under the second shallower isolation region 485 in SP and stops at about the midline of the device region. The FP and SP wells abut at about the midline between FP and SP forming the NP junction. In one embodiment, the FP and SP wells 422 and 424 abut under the third shallower isolation region 486 which is formed at about the midline and form the NP junction. As shown, the NP junction is formed below the third shallower isolation region 486. The implant mask 459 may be removed by, for example, ashing.

Figure 4H:
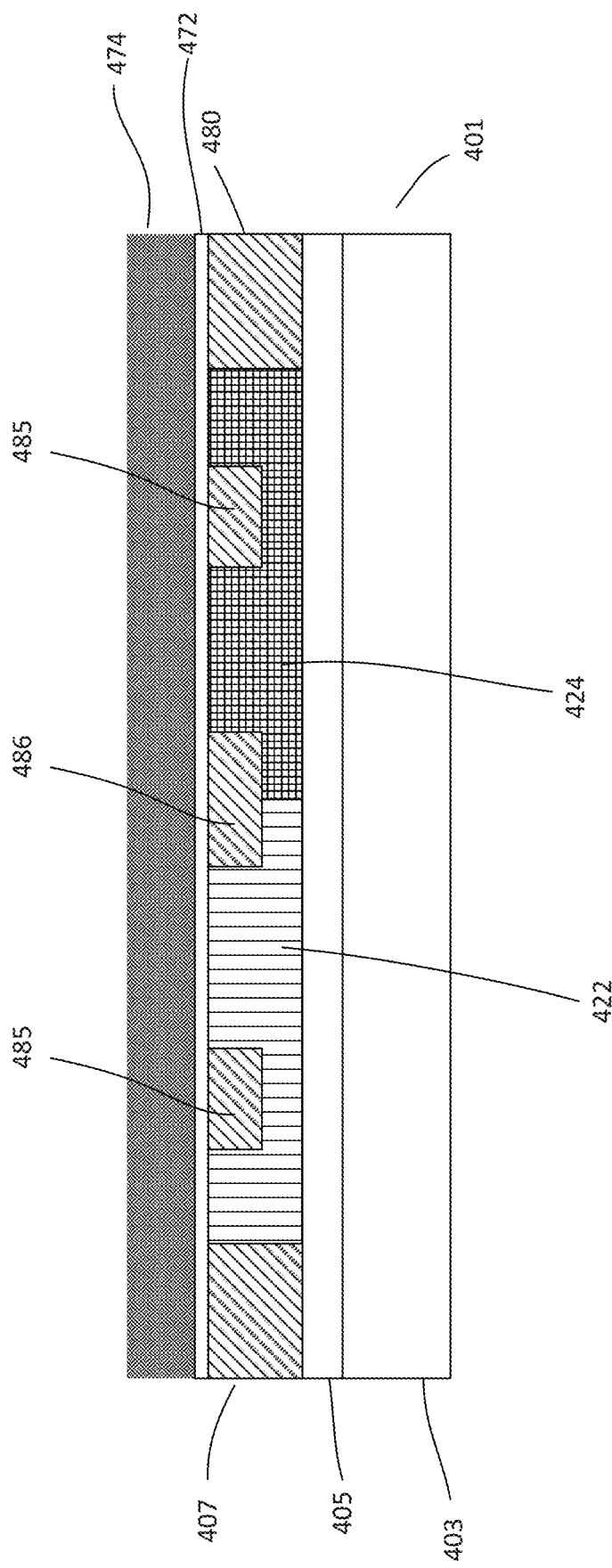

FIG. 4h shows the formation of gate layers. The gate layers, for example, include a gate dielectric layer 472 formed on the surface substrate 407 and a gate electrode layer 474 formed thereon. The gate dielectric layer 472, for example, is silicon oxide. The thickness of the gate dielectric layer may be, for example, about 40~500 Å or even thinner in advanced technologies. Other suitable thicknesses may also be useful. The gate dielectric layer may be formed by thermal oxidation. For example, the gate dielectric layer is formed by wet oxidation followed by annealing the substrate in an oxidizing ambient. The temperature of the wet oxidation can be, for example, about 600-900° C. The annealing can be, for example, performed at a temperature of about 600-1000° C. Other techniques or a combination of techniques may also be useful. For example, CVD may be used to either form a high temperature oxide layer or a low temperature oxide layer.

The gate electrode layer 474, for example, may be a polysilicon gate electrode layer. Polysilicon may be formed by CVD. The gate electrode layer can be formed as an amorphous or non-amorphous layer. The gate electrode layer, for example, is a conformal layer, following the profile of the gate dielectric layer. Other techniques for forming the gate electrode layer may also be useful. In one embodiment, the gate electrode layer is polysilicon doped with first polarity type dopants. Various techniques may be employed to dope the gate electrode layer, for example, in-situ doping or ion implantation.

In some embodiments, the gate dielectric and electrode layers may be other types of layers. For example, the gate dielectric layer may be a high k dielectric layer while the gate electrode layer may be a metal gate electrode layer. Other configurations of gate layers may also be useful. For example, the gate dielectric and/or gate electrode layers may have multiple layers. The layers can be formed by various techniques, such as thermal oxidation, CVD and sputtering.

FIGS. $4i_1$-$4i_2$, FIGS. $4j_1$-$4j_2$ and FIGS. $4k_1$-$4k_2$ show process flow for defining the gates and various doped and contact regions of the ESD protection device. Figures with subscript 1 show cross-sectional views taken along A-A' of FIG. 2a while figures with subscript 2 illustrate cross-sectional views taken along B-B' of FIG. 2a. Referring to FIGS. $4i_1$-$4i_2$, the process 400 continues by processing the gate layers. The gate layers are patterned to define a gate structure over the surface substrate. The gate structure, for example, includes a vertical gate 470 formed over the third shallower isolation region at about the midline of the device region which extends along the y-direction. The gate structure, for example, also includes one or one or more horizontal gates 476 extend along the x-direction when viewed from top. An etch mask (not shown) may be employed to pattern the gate layers to form the vertical and horizontal gates having layout shown in FIG. 2a. For example, a soft mask (not shown), such as a photoresist layer, is formed over the gate layers. To improve lithographic resolution, an ARC may be used below the photoresist layer. An exposure source may selectively expose the photoresist layer through a reticle containing the desired pattern. After selectively exposing the photoresist layer, it is developed to form openings corresponding to locations where the gate layers are to be removed. An anisotropic etch, such as RIE, is performed to remove portions of the gate layers unprotected by the patterned resist mask and form the gate structure having vertical and horizontal gates. As shown in FIG. $4i_1$, the vertical gate 470 overlaps the third shallower isolation region 486 at about the midline of the device region and partially overlaps the FP and SP wells at the NP junction. The one or more horizontal gates 476, for example, partially overlap the FP and SP wells and traverse the shallower isolation regions 485 in the FP and SP as shown in FIG. $4i_2$.

FIGS. $4j_1$-$4j_2$ show the formation of first FP contact region 442 and second SP contact region 454 in the surface substrate. An implant mask 448, such as a photoresist, may be formed over the surface substrate and covers the gates. The implant mask, for example, include openings which expose portions of the surface substrate where the first FP and second SP contact regions are formed. First polarity type dopants, such as N-type dopants, are implanted into exposed portions of the surface substrate, forming heavily doped first FP and second SP contact regions. The first FP and second SP contact regions are heavily doped and may extend to the bottom of surface substrate layer. As shown, the first FP contact region 442 is formed outside the first side of the horizontal gate 476 near the outer edge of device region which is distal from the SP. As for the second SP contact region 454, it is formed adjacent to a second side of the vertical gate 470 in the second portion. The first FP contact region 442, for example, serves as a body contact region to connect to the FP well 422. The implant mask 448 is removed, for example, by ashing.

FIGS. $4k_1$-$4k_2$ show the formation of second FP contact region 444 and first SP contact region 452 in the surface substrate. An implant mask 479, such as a photoresist, may be formed over the surface substrate and covers the gates. The implant mask, for example, includes openings which expose portions of the surface substrate where the second FP and first SP contact regions are formed. Second polarity type dopants, such as P-type dopants, are implanted into exposed portions of the surface substrate, forming heavily doped second FP and first SP contact regions. The second FP and first SP contact regions are heavily doped and may extend to the bottom of surface substrate layer. As shown, the second FP contact region 444 is formed adjacent to a first side of the vertical gate 470 in the FP while the first SP contact region 452 is formed outside the horizontal gate 476 near the outer edge of device region which is distal from the FP. The first SP contact region 452, for example, serves as a body contact region to connect to the SP well 424. The implant mask 479 is removed, for example, by ashing.

Annealing procedure is performed to activate the implants of first and second polarity dopants in the contact regions. Process continues with back-end-of-line (BEOL) processing. A pre-metal dielectric (PMD) layer (not shown) is formed on the substrate. Contact plugs (not shown) are formed in the PMD layer and connect to the first and second FP contact regions 442 and 444 and first and second SP contact regions 452 and 454. The contact plugs, for example, may be tungsten contact plugs. Other types of conductive contact plugs may also be useful. Silicide contacts (not shown) may also be formed over the contact regions of the SCR-based ESD protection device. The silicide contacts (not shown), for example, may be nickel-based silicide contacts. Other types of silicide contacts may also be useful. The silicide contacts may be employed to reduce contact resistance and facilitate contact to the back-end-of-line metal interconnects.

After the contact plugs are formed, inter metal dielectric (IMD) layer (not shown) is formed over the PMD layer. Damascene trenches are formed in the IMD layer using mask and etch processes. The trenches correspond to conductive lines which are in communication with contact plugs in the PMD layer. The trenches are filled with a conductive material, such as copper or copper alloy. Excess conductive materials are removed by, for example, CMP to provide a planar top surface with exposed interconnect lines. Other techniques for forming the conductive lines and plugs as well as using other types of conductive materials may also be useful. For example, aluminum or aluminum alloy with RIE techniques may also be used to form an aluminum type interconnection. The contact plugs couple the first and second FP contact regions 442 and 444 to conductive lines coupled with high power source, such as $V_{DD}$, while the contact plugs couple the first and second SP contact regions 452 and 454 to conductive lines coupled with low power source, such as $V_{SS}$ or ground.

The process continues to complete forming the device. For example, additional processes may be performed to complete the device. Such processes may include forming additional interconnect metal levels, final passivation, dicing, packaging and testing.

As described in FIGS. 4a-4k, the ESD protection device formed by process 400 includes an internal isolation region (or shallower isolation region) 486 formed below the vertical gate 470. The patterns of the reticles used in forming the shallower isolation regions may be easily modified to form the ESD protection device as shown and as described in FIGS. 3a-3c where no shallower isolation region is formed below the vertical gate 470.

The process 400 as described above results in various advantages. For example, the process as described in FIGS. 4a-4k allows a SCR-based ESD protection device to be formed in SOI substrate. This technique can be implemented in a CMOS manufacturing process using SOI substrate without expensive modification. Thus, this process is low cost and highly compatible with CMOS/SOI process. This technique has the additional advantage of having shallower isolation regions with shallower depth adjacent to the body contact regions, which allows the body contact region to connect with the respective well of the junction transistor in SOI substrate and to eliminate floating body effect. This minimizes leakage and further reduces power consumption even during the standby mode when there is no ESD event.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a silicon controlled rectifier, the method comprising:
   providing a substrate having a bulk substrate and a surface substrate separated from the bulk substrate by a buried insulator layer;
   forming a device isolation region in the surface substrate that surrounds a device region, wherein the device isolation region extends from a top surface of the surface substrate to the buried insulator layer;
   forming a plurality of internal isolation regions that extend from the top surface of the surface substrate to a partial depth of the surface substrate such that a plurality of internal contact regions are defined within the device region and portions of the surface substrate are arranged between bottoms of the internal isolation regions and the buried insulator layer;
   forming a first well and a second well of opposite polarity types in the internal contact regions and that abut in one of the portions of the surface substrate to define a junction between the first well and the second well;
   masking a first masked portion of the device region over the plurality of internal isolation regions and the plurality of internal contact regions;
   masking a second masked portion of the device region over the plurality of internal isolation regions and the plurality of internal contact regions, wherein the second masked portion is laterally spaced from the first masked portion;
   forming a first gate over a third masked portion of the device region between the first masked portion and the second masked portion; and
   forming a first contact and a second contact in the internal contact regions within respective unmasked portions of the device region laterally between the first masked portion of the device region and the second masked portion of the device region,
   wherein the first contact and the second contact have the opposite polarity types, the third masked portion of the device region is laterally between the respective unmasked portions of the device region, and the junction between the first well and the second well is located in part in the third masked portion.

2. The method of claim 1 wherein masking the first masked portion of the device region comprises:
   forming a second gate extending in a first direction completely across the first masked portion of the device region.

3. The method of claim 2 wherein masking the second masked portion of the device region comprises:
   forming a third gate extending in the first direction completely across the second masked portion of the device region.

4. The method of claim 3 wherein the first gate extends from the third gate to the second gate in a second direction that is transverse to the first direction.

5. The method of claim 2 wherein the junction between the first well and the second well is located in part beneath the second gate, and one of the internal isolation regions is arranged between the second gate and the junction between the first well and the second well.

6. The method of claim 1 wherein the first contact is located in the first well, the first contact is p-type, and the first well is n-type.

7. The method of claim 6 wherein the second contact is located in the second well, the second contact is n-type, and the second well is p-type.

8. The method of claim 1 further comprising:
   forming a first body contact coupled to the first well and a second body contact coupled to the second well,
   wherein the plurality of internal isolation regions and the plurality of internal contact regions are laterally positioned between the first body contact and the second body contact.

9. The method of claim 3 further comprising:
forming a first body contact coupled to the first well and a second body contact coupled to the second well,
wherein the first gate, the second gate, and the third gate are laterally positioned between the first body contact and the second body contact.

\* \* \* \* \*